United States Patent
Ichige et al.

(10) Patent No.: US 6,921,960 B2
(45) Date of Patent: Jul. 26, 2005

(54) CAPACITOR ELEMENT WITH AN OPENING PORTION FORMED IN A PERIPHERAL CIRCUIT

(75) Inventors: Masayuki Ichige, Kanagawa-ken (JP); Riichiro Shirota, Kanagawa-ken (JP); Kikuko Sugimae, Kanagawa-ken (JP); Atsuhiro Sato, Kanagawa-ken (JP); Yuji Takeuchi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/984,718

(22) Filed: Oct. 31, 2001

(65) Prior Publication Data

US 2002/0070402 A1 Jun. 13, 2002

(30) Foreign Application Priority Data

Oct. 31, 2000 (JP) .................................. P2000-333732

(51) Int. Cl.⁷ ........................ H01L 29/00; H01L 29/788
(52) U.S. Cl. ........................ 257/532; 257/315; 257/510; 438/393
(58) Field of Search .............................. 257/315, 510, 257/532; 438/393

(56) References Cited

U.S. PATENT DOCUMENTS

| 5,879,983 | A | * | 3/1999 | Segawa et al. | ............. | 438/253 |
| 5,894,147 | A | * | 4/1999 | Cacharelis | ................. | 257/316 |
| 5,946,230 | A | * | 8/1999 | Shimizu et al. | ......... | 365/185.01 |
| 6,174,822 | B1 | * | 1/2001 | Nagano et al. | ............. | 438/763 |
| 6,239,462 | B1 | * | 5/2001 | Nakao et al. | ................ | 257/310 |
| 6,291,307 | B1 | * | 9/2001 | Chu et al. | ................... | 438/393 |

FOREIGN PATENT DOCUMENTS

| JP | 2000-150789 | | 5/2000 |
| JP | 2000-223570 A | * | 8/2000 |

* cited by examiner

Primary Examiner—Howard Weiss
(74) Attorney, Agent, or Firm—Oblon, Spivak, McClelland, Maier & Neustadt, P.C.

(57) ABSTRACT

A semiconductor device includes a structure in which a first electrode layer, an inter-electrode insulating film and a second electrode layer are laminated in a main circuit in this order, and includes a capacitor element having a lower electrode formed of the same layer as the first electrode layer, a charge storage layer formed of the same layer as the inter-electrode insulating film, and an upper electrode formed of the second electrode layer. The semiconductor device further includes an opening portion formed in the charge storage layer, the opening portion having a bottom to which the lower electrode is exposed, and a first region electrically connected to the lower electrode via the opening portion and electrically isolated from the upper electrode, the first region being formed of the same layer as the second electrode layer.

27 Claims, 16 Drawing Sheets

CAPACITOR ELEMENT WITH AN OPENING PORTION FORMED IN A PERIPHERAL CIRCUIT

CROSS REFERENCE TO RELATED APPLICATION

This application is based upon and claims the benefit of priority from the prior Japanese Patent Application No. 2000-333732, filed on Oct. 31, 2000, the entire contents of which are incorporated herein by reference.

BACKGROUND OF THE INVENTION

1. Field of the Invention

The present invention relates to a semiconductor device and a method of manufacturing the same, and more particularly to a capacitor element for use in a peripheral circuit of a semiconductor device such as a non-volatile memory device and the like, which have a stacked gate structure and a multilayered electrode structure.

2. Description of the Related Art

Semiconductor devices (semiconductor chips) having a non-volatile memory cell such as an electrically programmable ROM (EPROM), an electrically erasable and programmable ROM (EEPROM), a flash memory and the like have a stacked gate structure having a floating gate electrode layer and a control gate electrode layer in their memory cell formation region. Moreover, on a substrate of each of these semiconductor devices, peripheral circuits such as a control circuit required for driving the memory cell are also formed together with the memory cells.

In a peripheral circuit region, there are provided thin film elements such as transistor elements, resistance elements, and capacitor elements, which are necessary for the respective peripheral circuits. These elements should be formed along with a memory cell portion for the sake of reducing burdens in processes.

For example, paying attention to a structure of a capacitor element used in the peripheral circuit, in a semiconductor device having a flash memory, a capacitor element which uses a layer forming a tunnel oxide film (first gate insulating film) as a charge storage layer has been heretofore formed, the tunnel oxide film being formed in a lower layer of a floating gate electrode layer. In this case, a layer forming the floating gate electrode layer and a semiconductor substrate have been used as a capacitor electrode.

However, a capacitor structure using a layer forming an inter-gate insulating film (second gate insulating film), which is formed between a floating gate electrode layer and a control gate electrode layer, as a charge storage layer of a capacitor element has been recently desired. This is because, since the inter-gate insulating film generally uses a higher dielectric material than the tunnel oxide film, a reduction in an area of the capacitor element can be more achieved when the inter-gate insulating film is used as the charge storage layer of the capacitor element.

SUMMARY OF THE INVENTION

A semiconductor device according to an embodiment of the present invention comprises a semiconductor substrate, a main circuit region provided on the semiconductor substrate, a structure in which a first electrode layer, an inter-electrode insulating film and a second electrode layer are sequentially laminated, the structure being formed in the main circuit region, a peripheral circuit region formed around the main circuit region on the semiconductor substrate, the peripheral circuit region having a capacitor element, a lower electrode of the capacitor element, the lower electrode being formed of the same layer as the first electrode layer and formed in the peripheral circuit region, a charge storage layer of the capacitor element, the charge storage layer being formed on the lower electrode and formed of the same layer as the inter-electrode insulating film, an opening portion formed on the charge storage layer, the opening portion allowing the lower electrode to be exposed to a bottom portion thereof, a first region formed on the opening portion and on the charge storage layer around the opening portion, the first region being formed of the same layer as the second electrode layer and electrically connected to the lower electrode via the opening portion, and an upper electrode of the capacitor element, the upper electrode being formed of the same layer as the second electrode layer on the charge storage layer and electrically isolated from the first region.

A method of manufacturing a semiconductor device according to an embodiment of the present invention comprises forming a first electrode layer in a main circuit region on a semiconductor substrate, as well as a lower electrode of a capacitor element in a peripheral circuit region, the lower electrode being formed of the same layer as the first electrode layer, forming an inter-electrode insulating film on the first electrode layer of the main circuit region, as well as a charge storage layer of the capacitor element in the peripheral circuit region, the charge storage layer being formed on the lower electrode and formed of the same layer as the inter-electrode insulating film, forming an opening portion in the charge storage layer in the peripheral circuit region, the opening portion allowing the lower electrode to be exposed, forming a second electrode layer on the inter-electrode film in the main circuit region while covering the charge storage layer and the opening portion in the peripheral circuit region with the second electrode layer, and patterning the second electrode layer in the peripheral circuit region, thus forming a first region electrically connected to the lower electrode via the opening portion and an upper electrode of the capacitor element electrically isolated from the first region.

DETAILED DESCRIPTION OF THE EMBODIMENTS (Self-alignment Type STI Structure)

Figure 1:
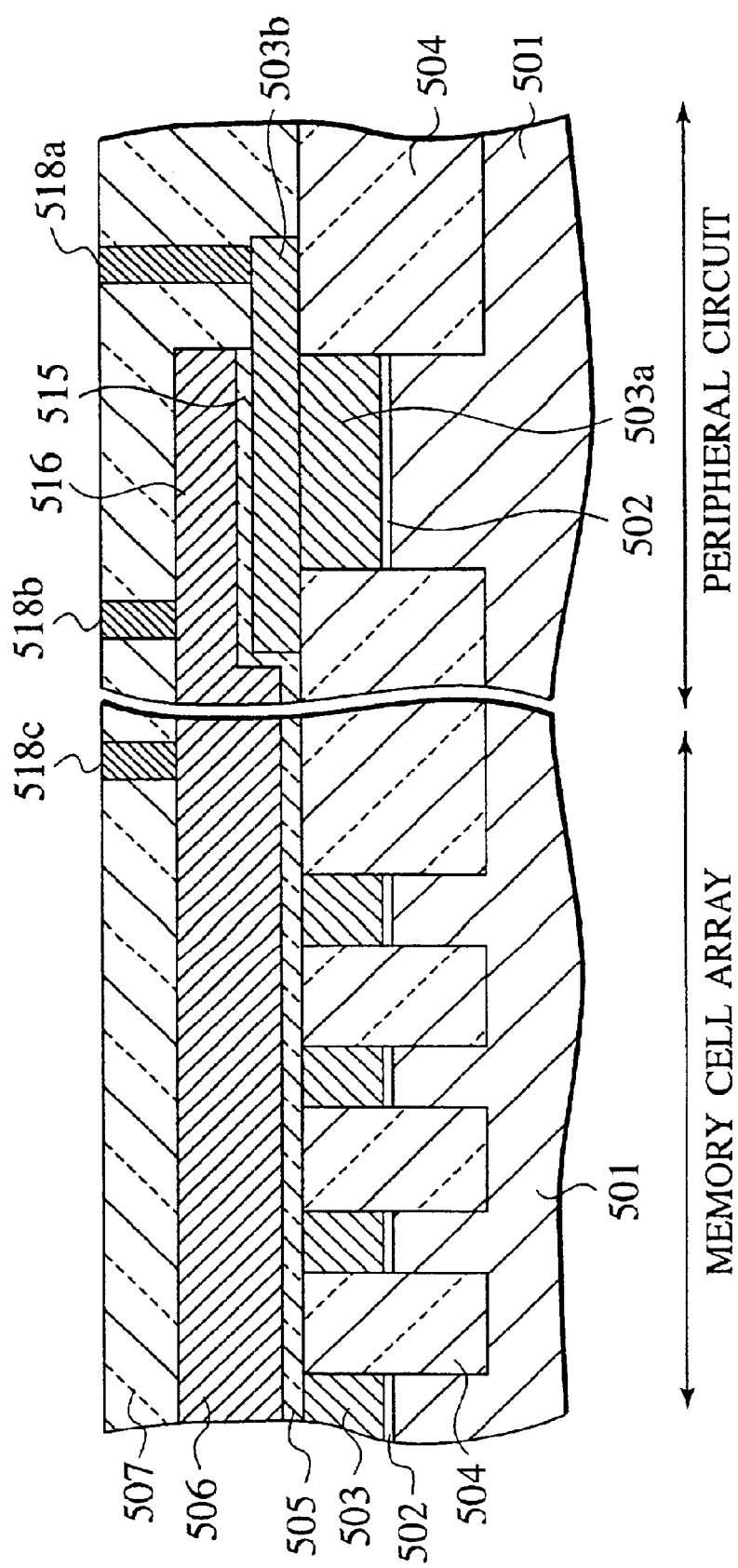
FIG. 1 is a section view showing a capacitor element structure in a memory cell region and a peripheral circuit region memory cell region of a semiconductor device having a non-volatile memory cell.

FIG. 1 is a section view showing an example of a semiconductor device having a non-volatile memory cell array, which uses an inter-gate insulating film as a capacitor element of a peripheral circuit. In the left of FIG. 1, a memory cell array region is shown, and in the right thereof, a peripheral circuit region is shown.

Each memory cell of the memory cell array shown in FIG. 1 is isolated from others by an element isolation region. In FIG. 1, the memory cells having a self-alignment type STI (shallow trench isolation) structure are shown.

With respect to the self-alignment type STI structure, in fabricating the memory cell array, a thin tunnel oxide film 502 and floating gate electrode layers 503 and 503a are first formed on a semiconductor substrate layer 501 by laminating the floating gate electrode layers 503 and 503a on the thin tunnel oxide film 502. Thereafter, trenches for the element isolation region are formed. An insulating film is formed on the surface so as to be buried in the trenches, and then CMP (chemical mechanical polishing) is performed until the floating gate electrode layers 503 and 503a are exposed. Thus, a STI layer 504 is obtained. In such a self-alignment type STI structure, the tunnel oxide film 502 and the floating gate electrode layer 503a are formed on the surface of the semiconductor substrate before the STI layer 504 is formed. Accordingly, when the STI layer 504 is formed, an active region (element region) is defined by the STI layer 504, and, at the same time, a plane pattern frame of the tunnel oxide film 502 and the floating gate electrode layer 503 is defined by a position of a side wall of the STI layer 504.

Thereafter, an inter-gate insulating film 505 and a control gate electrode layer 506 are sequentially formed on the surface, and then necessary patterning is performed, followed by covering the surface with an interlayer insulating layer 507. The interlayer insulating layer 507 is perforated to form necessary contact holes 508a to 508c, and the contact holes 508a to 508c are filled with conductive films, respectively. These conductive films are connected to wires formed on the interlayer insulating layer 507.

The above-described self-alignment type STI structure can be structurally scale-downed. Specifically, a size of a unit memory cell can be set to 4 $F^2$ for a minimum processing dimension unit F. When a capacitor element using the inter-gate insulating film as a charge storage layer is formed in the peripheral circuit region, a floating gate electrode layer pattern 503a constituting the capacitor is formed in a self-alignment manner in the active region.

Figure 2A:
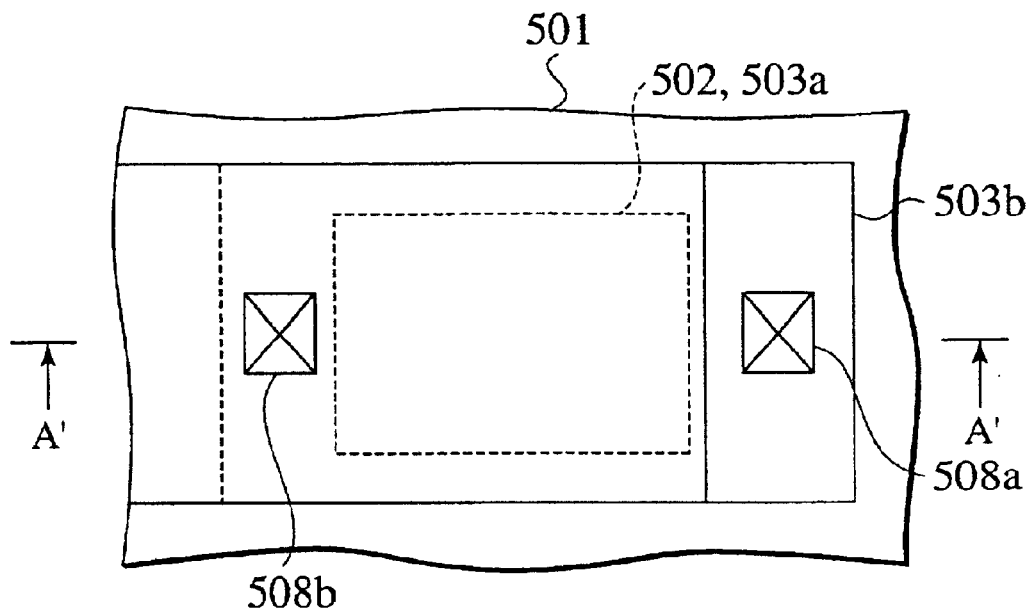
FIG. 2A is a plan view showing the capacitor element structure in the peripheral circuit region of the semiconductor device having the non-volatile memory cell.
Figure 2B:
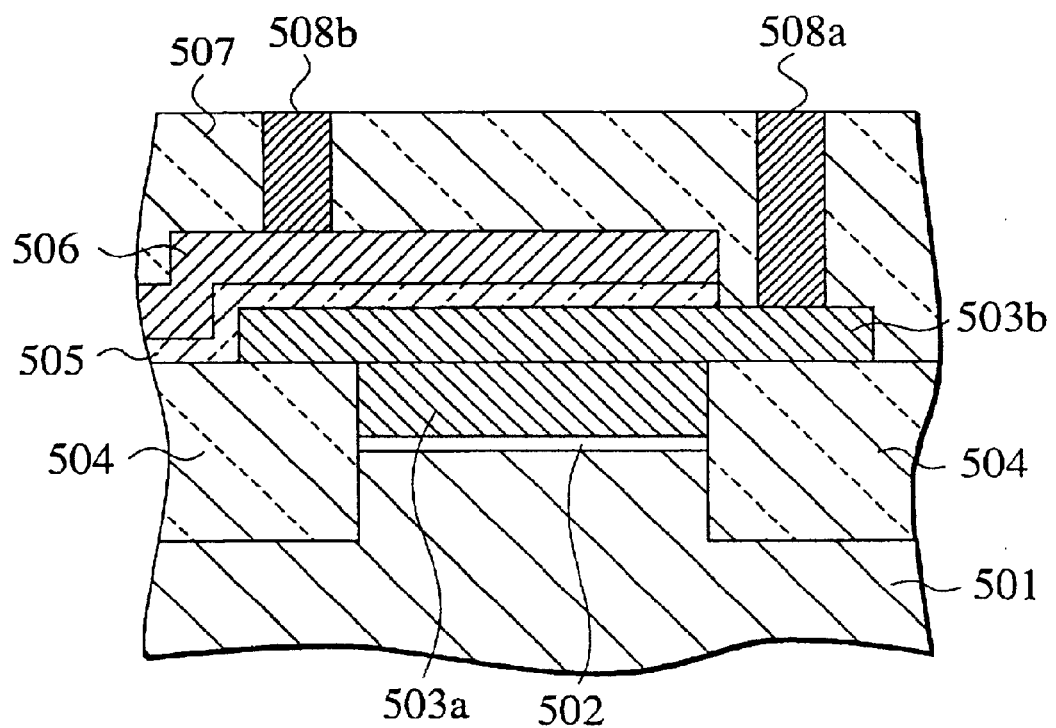
FIG. 2B is a section view showing the capacitor element structure in the peripheral circuit region of the semiconductor device having the non-volatile memory cell.

FIG. 2A is a plan view showing only the capacitor element structure in the peripheral circuit region of the flash memory shown in FIG. 1, and FIG. 2B is a section view taken along the line A–A' on the plan view of FIG. 2A. FIGS. 3A to 3E are steps showing a method of manufacturing the capacitor element shown in FIGS. 2A and 2B. Descriptions for the capacitor element formed in the peripheral circuit region will be made with reference to these drawings.

To form the capacitor element structure using the floating gate electrode layer, the inter-gate insulating film and the control gate electrode layer in the peripheral circuit region, it is necessary to form contact holes in the interlayer insulating layer and to form drawing electrodes for connecting the electrodes to wires. However, a dry etching process required for forming the contact holes is likely to damage layers disposed under the contact holes. Accordingly, when the contact holes are formed in the element region (active region), the formation of the contact holes may cause damages to the semiconductor substrate layer and the gate insulating film, and these damages may bring characteristic deterioration such as a current Icak to various circuit elements. Accordingly, in order to avoid this problem, generally, the contact holes are not formed in the active region, but formed in the element isolation region.

As shown in FIGS. 2A and 2B, since the floating gate electrode layer pattern 503a is formed in the active region in the flash memory adopting the self-alignment type STI structure, it is impossible to form the contact holes directly on the floating gate electrode layer pattern 503a. Accordingly, an electrode layer 503b is formed on the floating gate electrode layer pattern 503a, which is formed of the same conductive material as the floating gate electrode layer pattern 503a. At this time, the electrode layer 503b is allowed to extend onto the STI layer 504 that is an element isolation region, and the contact hole 508a is formed on a portion of the electrode layer 503b which extends onto the STI layer 504, followed by an electrode drawing-out.

Figure 3A:
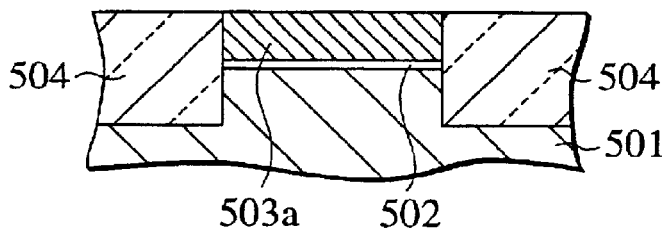
FIGS. 3A to 3E are steps showing a method of manufacturing a capacitor element in a peripheral circuit region of a semiconductor device having a non-volatile memory cell.
Figure 3B:
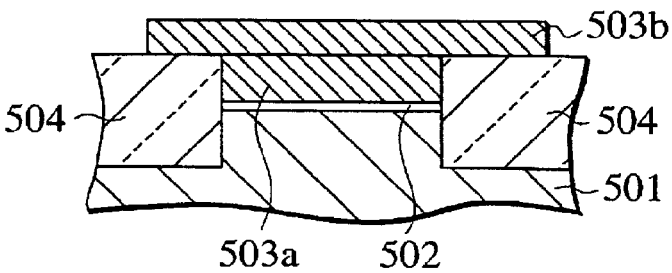
Figure 3C:
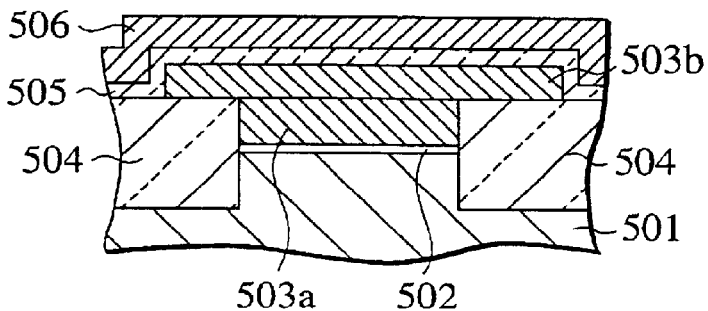
Figure 3D:
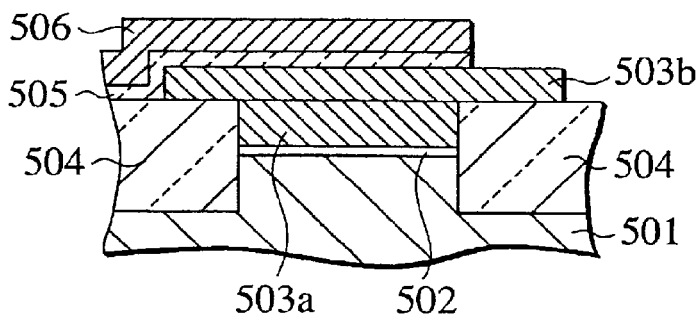
Figure 3E:
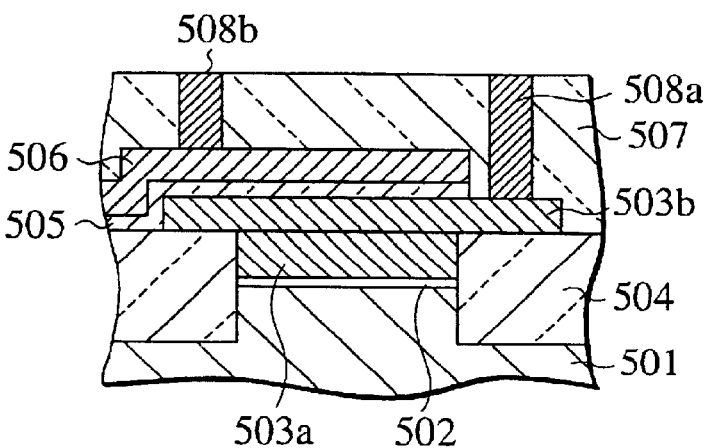

This capacitor element is fabricated by steps shown in FIGS. 3A to 3E. Specifically, the floating gate electrode layer pattern 503a is formed together with the STI layer 504 in a self-alignment manner as shown in FIG. 3A. As shown in FIG. 3B, the electrode layer 503b formed of the same material as the floating gate electrode layer is formed on the floating gate electrode layer pattern 503a, and then the electrode layer 503b is patterned so that the electrode is drawn out onto the STI layer 504. Next, the inter-gate insulating film 505 and the control gate electrode layer 506 are formed in this order (FIG. 3C). As shown in FIG. 3D, the inter-gate insulating film 505 and the control gate electrode layer 506 are patterned so that the electrode layer 503b is partially exposed on the STI layer 504. As shown in FIG. 3E, the interlayer insulating layer 507 is formed on a surface of the resultant structure, and the contact holes 508a and 508b are formed on the electrode layer 503b on the STI layer 504 and on, the control gate electrode layer 506 above the STI layer 504, respectively. The contact holes 508a and 508b are filled with a conductive material, and the conductive material is used as a drawing-out line from each electrode layer.

However, in the above-described structure, since the lamination process of the electrode layer 503b for drawing out the lower electrode of the capacitor element must be additionally performed, in the peripheral circuit region it is substantially impossible to effectively make use of the floating gate electrode layer pattern 503a formed in a self-alignment manner.

Furthermore, the above-described example concerns the semiconductor device having the self-alignment type STI structure. However, a semiconductor device which does not adopt the self-alignment type STI structure is involved in a similar problem to the above as to the drawing-out of a conductive material from a lower electrode of a capacitor element. Specifically, such a problem occurs when a fabrication of a capacitor element using the same structure as that of the above semiconductor device is desired, in a case where a floating gate electrode layer and a control gate electrode layer, which constitute a stacked gate structure, are collectively etched and the same plane pattern is obtained.

Moreover, besides the semiconductor device having the non-volatile memory region, when a fabrication of a semiconductor device, in which a structure having a multilayered electrode layer constituted by a gate layer and a wiring layer is provided in a main circuit region and a capacitor element using the multilayered electrode structure is provided in a peripheral circuit region, is desired, a similar problem to the above occurs.

(First Embodiment)

Figure 4A:
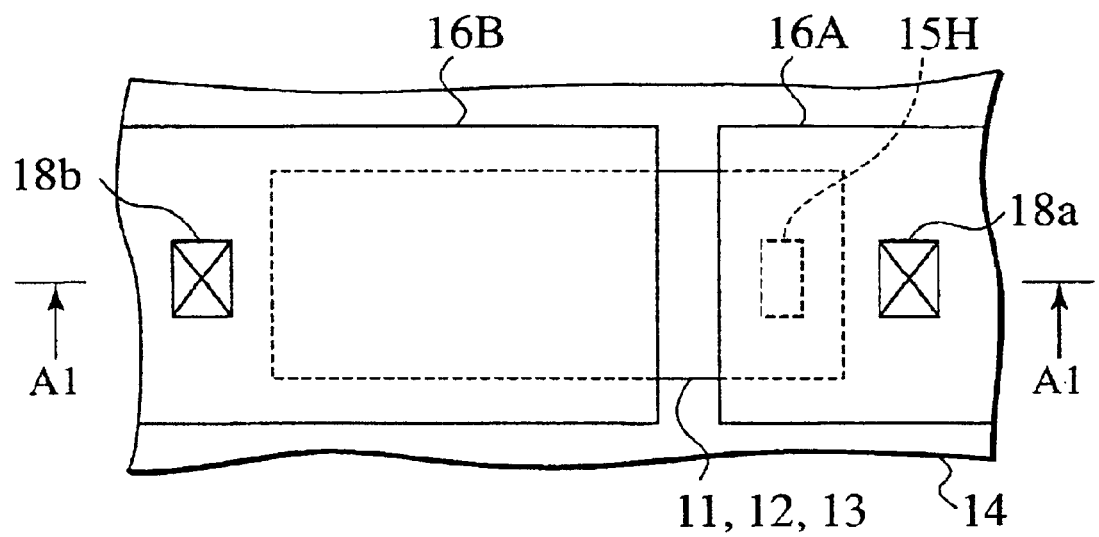
FIG. 4A is a plan view showing a capacitor element structure in a peripheral circuit region of a semiconductor device according to a first embodiment of the present invention.
Figure 4B:
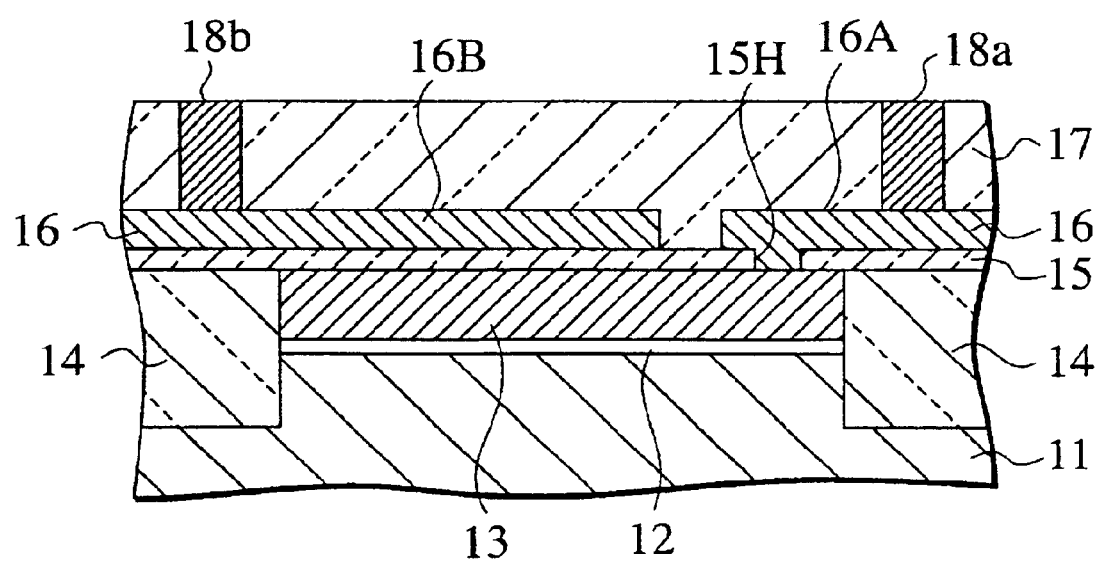
FIG. 4B is a section view showing the capacitor element structure in the peripheral circuit region of the semiconductor device according to the first embodiment of the present invention.

FIG. 4A is a plan view of a capacitor element formed in a peripheral circuit region of a semiconductor device according to a first embodiment. FIG. 4B is a section view taken along the line A1—A1 in FIG. 4A.

The semiconductor device according to the first embodiment has a lamination structure that a first electrode layer, an inter-electrode insulating film and a second electrode layer are formed in a main circuit region on a semiconductor substrate in this order, and has a capacitor element using the same structure as this lamination structure in a peripheral circuit region.

Herein, sorts of circuits formed in the main circuit region are not particularly limited. As described later, a non-volatile memory having a stacked gate structure will do, and a logic circuit and the like having a multilayered wiring structure will do.

As shown in FIGS. 4A and 4B, in the semiconductor device according to the first embodiment, each element region (active region) of a semiconductor substrate 11 is defined by a STI layer 14 that is a trench type element isolation region, and a pattern of a first electrode layer 13 is formed in a self-alignment manner with the STI layer 14 in each element region.

The capacitor element has a constitution that the first electrode layer 13 serves as a lower electrode, an inter-electrode insulating film 15 formed on the first electrode layer 13 serves as a charge storage layer, and a second electrode layer 16 serves as an upper electrode. Although a first insulating film 12 may be left between the first electrode layer 13 and the semiconductor substrate layer 11, the first insulating film 12 is not particularly necessary for the capacitor element.

The inter-electrode insulating film 15 is formed broadly so as to cover the surfaces of the first electrode layer 13 and the element isolation region (STI layer) 14, and has an opening portion 15H which partially exposes the surface of the first electrode layer 13. The second electrode layer 16 is separated into first and second regions 16A and 16B by patterning, and the opening portion 15H is filled with the second electrode layer 16. Therefore, the first region 16A and the first electrode layer 13 are electrically connected via the opening portion 15H.

An interlayer insulating layer 17 is formed on the second electrode layer 16, and to perform an electrode drawing-out from the upper and lower electrodes of the capacitor element, contact holes 18a and 18b are formed on the first and second regions 16A and 16B of the second electrode layer 16, respectively. Herein, formation positions of the contact holes 18a and 18b are located just above the element isolation region 14.

FIGS. 5A to 5E are steps showing a method of forming the capacitor element according to the first embodiment shown in FIGS. 4A and 4B. These steps shall progress along with formations of elements in the main circuit region.

Figure 5A:
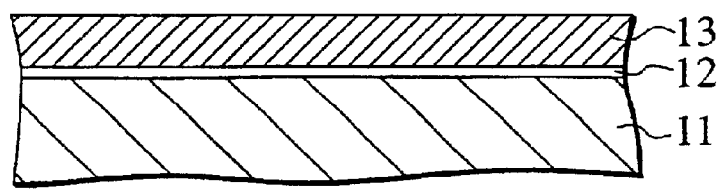
FIGS. 5A to 5B are steps showing a method of manufacturing a semiconductor device according to the first embodiment of the present invention.
Figure 5B:
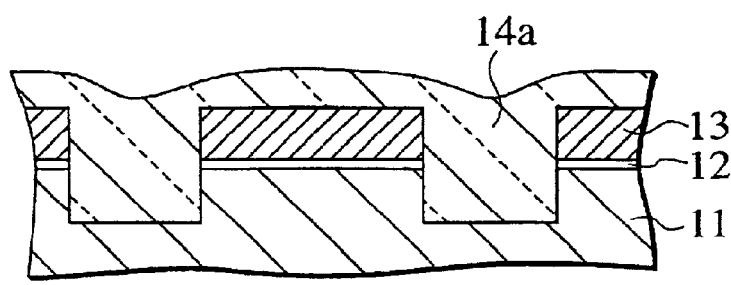

As shown in FIG. 5A, before the element isolation region is formed, the first electrode layer 13 formed of such as polycrystalline Si is first formed on the surface of the semiconductor substrate layer 11 with the first insulating film 12 formed of such as $SiO_2$ interposed therebetween. As shown in FIG. 5B, the trench for the element isolation region is formed in the surfaces of the first electrode layer 13 and the first insulating film 12, which reaches the semiconductor substrate layer 11. This trench shall have a depth which reaches from the first electrode layer 13 to the semiconductor substrate layer 11 below the first electrode layer 13. By use of a CVD (chemical vapor deposition) method or the like, an insulating film 14a formed of, for example, a silicon oxide film, a silicon nitride film or the like is formed on a surface of the resultant structure so as to be buried in the trench.

Figure 5C:
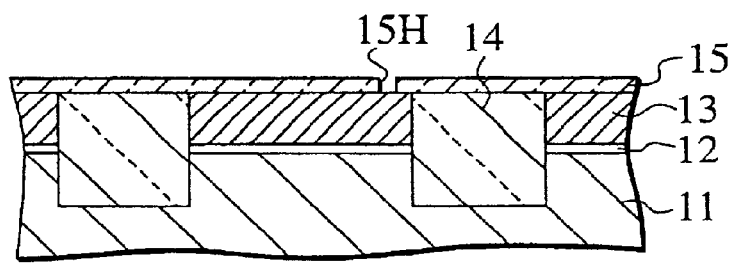

Subsequently, as shown in FIG. 5C, CMP (chemical mechanical polishing) is performed so that the first electrode layer 13 is exposed to the substrate surface, and the surface is flattened. Thus, the STI layer 14 that is the trench type element isolation region is formed. The STI layer 14 defines the element formation regions, and electrically isolates each element formation region from others. Furthermore, at this time, the STI layer 14 simultaneously defines the plane pattern of the first electrode layer 13 in a self-alignment manner. Specifically, the plane pattern frame of the first electrode layer 13 is defined by the side plane of the STI layer 14.

The inter-electrode insulating film 15 is formed on the flattened surface. A silicon oxide film, a silicon nitride film or a laminated film composed of these films may be used as the insulating film 14a. A film showing high dielectric constant should be preferably used because the insulating film 14a is used as the charge storage layer of the capacitor element. Subsequently, the opening portion 15H which exposes the first electrode layer 13 partially is formed by etching in the inter-electrode insulating film 15 in the element formation region. Since this etching is not such deep etching as for forming the contact hole, this etching never damages the semiconductor substrate and the gate insulating film via the first electrode layer 13.

Figure 5D:
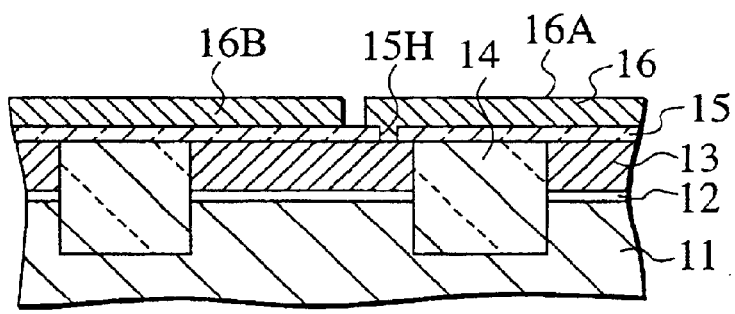

As shown in FIG. 5D, the second electrode layer 16 is formed on the inter-electrode insulating film 15 so as to be buried in the opening portion 15H. Furthermore, the second electrode layer 16 is separated into the first and second regions 16A and 16B by use of a photolithography process. The first region 16A is electrically connected to the first electrode layer 13 in the element region via the opening portion 15H.

Figure 5E:
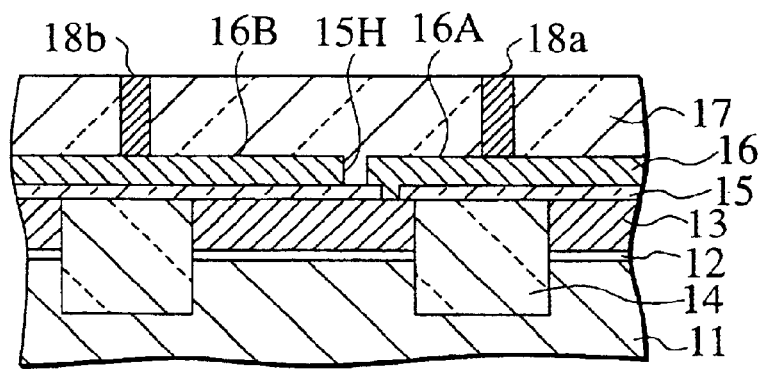

Thereafter, as shown in FIG. 5E, the interlayer insulating layer 17 is formed on a surface of the resultant structure, and furthermore, the contact holes 18a and 18b are formed in the first and second regions 16A and 16B of the second electrode layer 16, respectively. The bottoms of the contact holes 18a and 18b contact the surfaces of the first and second regions 16A and 16B, respectively. Thus, the upper electrode of the capacitor element is constituted by the second region 16B of the second electrode layer 16, and connected to the external wiring via the contact hole 18b. The lower electrode of the capacitor element is constituted by the first electrode layer 13, and connected to the external wiring via the opening portion 15H, the first region 16A of the second electrode layer 16 and the contact hole 18a.

As described above, though the capacitor element structure and the method of manufacturing the same according to the first embodiment requires the patterning steps for forming the opening portion 15H and for separating the second electrode layer 16 into the first and second regions 16A and 16B, these patterning steps are common to those required for forming various wirings and resistance, which are formed in the peripheral circuit region. Accordingly, an increase in the number of the manufacturing steps in fabricating the semiconductor device is small. According to the capacitor element structure and the method of manufacturing the same shown in the first embodiment, the first electrode layer 13 formed in a self-alignment manner with the element isolation region is effectively used, whereby the capacitor element can be formed in the peripheral circuit region without burdens of the processes.

(Second Embodiment)

Figure 6A:
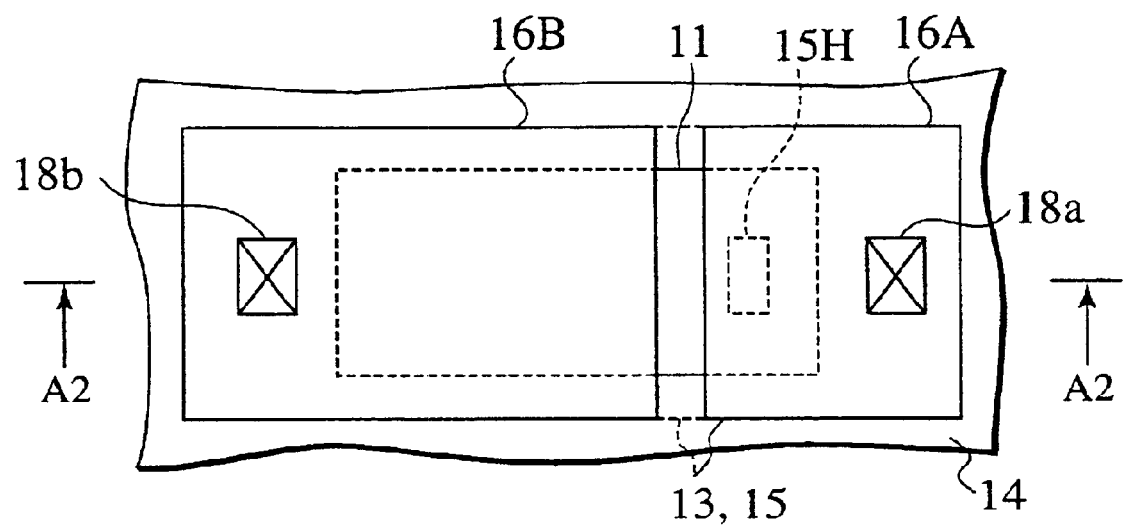
FIG. 6A is a plan view showing a capacitor element structure in a peripheral circuit region of a semiconductor device according to a second embodiment of the present invention.
Figure 6B:
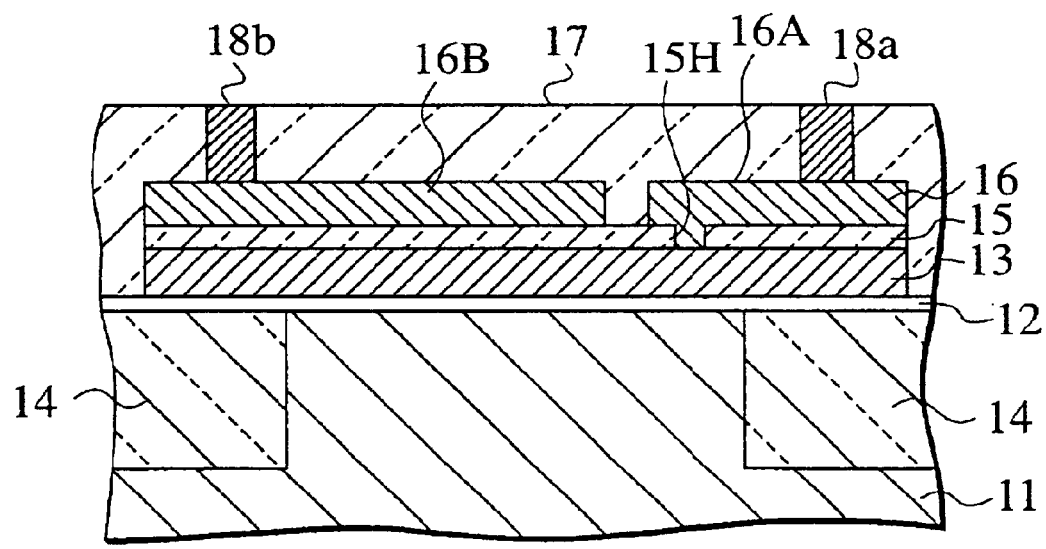
FIG. 6B is a section view showing the capacitor element structure in the peripheral circuit region of the semiconductor device according to the second embodiment of the present invention.

FIG. 6A is a plan view of a capacitor element formed in a peripheral circuit region of a semiconductor device according to a second embodiment. FIG. 6B is a section view taken along the line A2—A2 in FIG. 6A.

As shown in these drawings, the semiconductor device according to the second embodiment is a modification of the first embodiment. Although, with respect to a principal capacitor element structure, this modification of the semiconductor device is common to the semiconductor device according to the first embodiment, this modification thereof is different from the semiconductor device according to the first embodiment in that the first electrode layer 13 is formed independently from the STI layer 14 that is the element isolation region.

As shown in FIGS. 6A and 6B, the STI layer 14 is the trench type element isolation region formed so as to be buried in the semiconductor substrate, and the first insulating film 12, the first electrode layer 13, the inter-electrode insulating film 15 and the second electrode layer 16 are laminated on the surface of the semiconductor substrate 11 and the surface of the STI layer 14. The opening portion 15H is formed in the inter-electrode insulating film 15, and the second electrode layer 16 covers the inter-electrode insulating film 15 and the opening portion 15H. The second electrode layer 16 is formed so as to be separated into the first region 16A electrically connected to the first electrode layer 13 via the opening portion 15H and the second region 16B constituting the upper electrode of the capacitor element.

As shown in FIGS. 6A and 6B, the first electrode layer 13, the inter-electrode insulating film 15 and the second electrode layer 16, which constitute the capacitor element, have periphery portions shaped into the same plane pattern.

The interlayer insulating layer 17 is formed on the capacitor element, and the contact holes 18a and 18b for connecting the electrodes to the wirings are respectively provided on the first and second regions 16A and 16B of the second electrode layer 16, which are disposed above the respective element isolation regions 14.

Figure 7A:
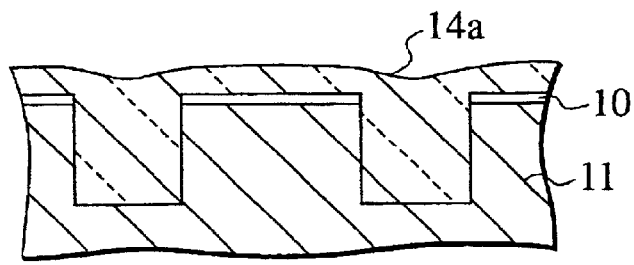
FIGS. 7A to 7E are steps showing the method of manufacturing the semiconductor device according to the second embodiment of the present invention.
Figure 7B:
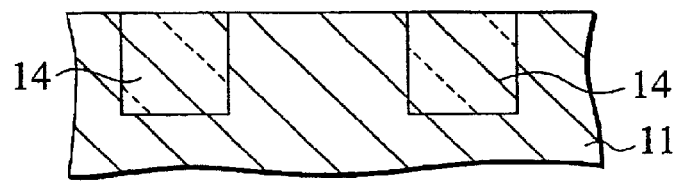
Figure 7C:
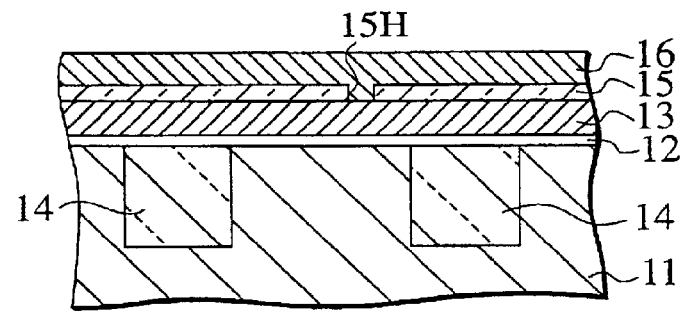

FIGS. 7A to 7E show steps of manufacturing the capacitor element according to the foregoing second embodiment. As shown in FIG. 7A, the trench for the element isolation region is formed in the semiconductor substrate 11 on which a dummy oxide film 10 is formed, and the insulating film 14a covers the dummy oxide film 10 so as to be buried in the trench. Subsequently, the surface of the substrate is flattened by a CMP process or an etching back process, so as to expose the semiconductor substrate 11 (FIG. 7B). The first insulating film 12, the first electrode layer 13 and the inter-electrode insulating film 15 are laminated and formed on the resultant structure in this order. Thereafter, the opening portion 15H is formed in the inter-electrode insulating film 15 by etching. Moreover, as shown in FIG. 7C, the second electrode layer 16 is formed on the inter-electrode insulating film 15.

Figure 7D:
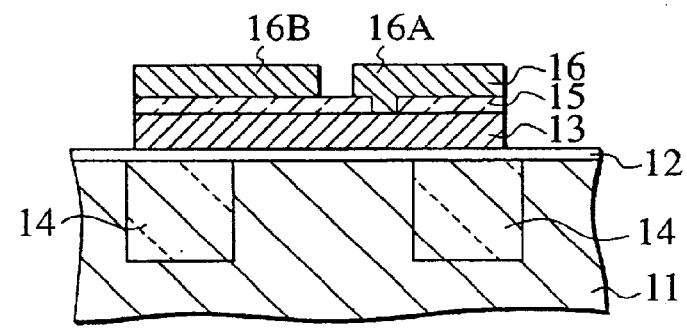

Thereafter, as shown in FIG. 7D, the first electrode layer 13, the inter-electrode insulating film (second insulating film) 15 and the second electrode layer 16 are separately or simultaneously patterned by use of a photolithography process. Subsequently, the second electrode layer 16 is patterned so as to be separated into the first and second regions 16A and 16B.

Figure 7E:
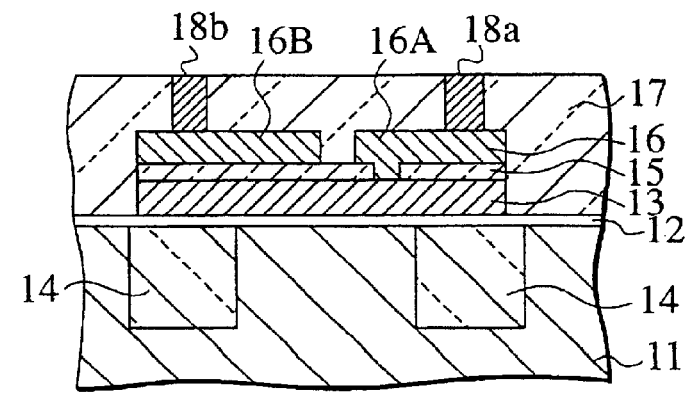

As shown in FIG. 7E, a surface of the resultant structure is covered with the interlayer insulating layer 17, and the contact holes 18a and 18b are formed in the interlayer insulating layer 17 on the first and second regions 16A and 16B, which are disposed above the element isolation regions, respectively.

As shown in the second embodiment, when the first electrode layer 13, the inter-electrode insulating film (second insulating film) 15 and the second electrode layer 16 constituting the laminated film are simultaneously patterned to the same plane shape without the formation of the first electrode layer 13 in a self-alignment manner with the STI layer 14, it is possible to electrically connect the lower electrode to the wiring without a significant increase in the number of the manufacturing steps by constituting a structure in which the electrode is drawn out from the second electrode layer 16A via the opening portion 15H in the inter-electrode insulating film 15. Note that, the plane patterns of the first electrode layer 13, the inter-electrode insulating film 15 and the second electrode layer 16 necessarily need not to be identical to each other.

(Third Embodiment)

Figure 8A:
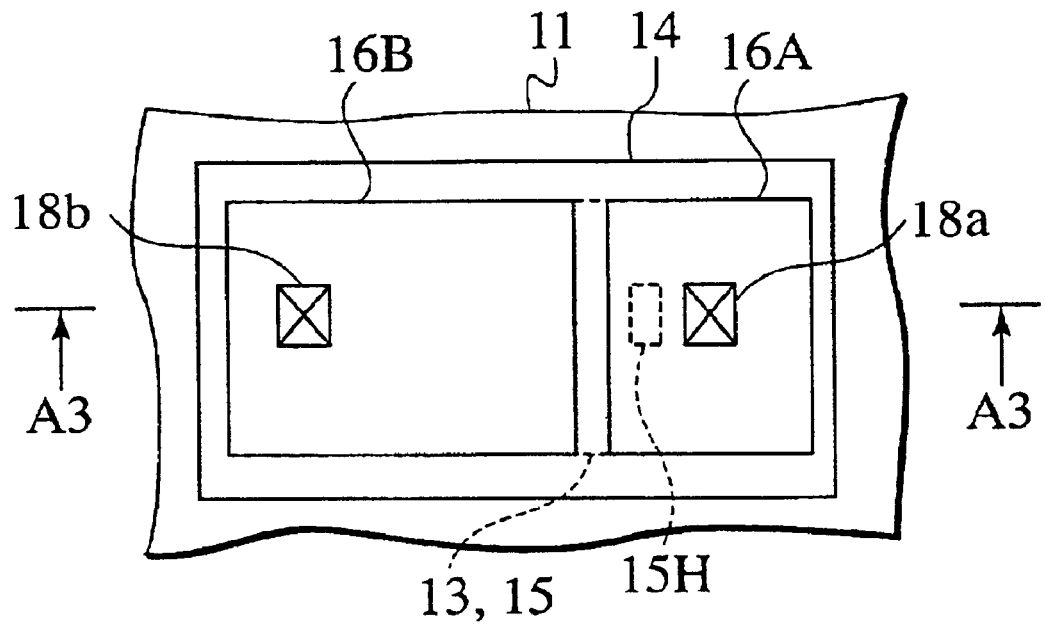
FIG. 8A is a plan view showing a capacitor element structure in a peripheral circuit region of a semiconductor device according to a third embodiment of the present invention.
Figure 8B:
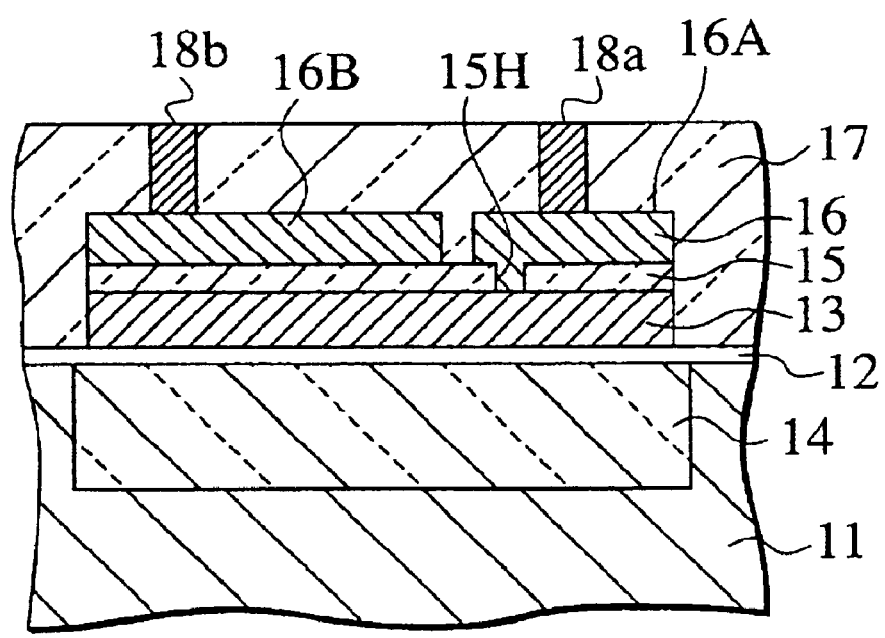
FIG. 8B is a section view showing the capacitor element structure in the peripheral circuit region of the semiconductor device according to the third embodiment of the present invention.

FIG. 8A is a plan view of a capacitor element formed in a peripheral circuit region of a semiconductor device according to a third embodiment. FIG. 8B is a section view taken along the line A3—A3 in FIG. 8A.

The first and second embodiments adopt the structure in which most of the parts of the capacitor element are formed on the element region. However, the semiconductor device according to the third embodiment concerns a semiconductor device in which the whole of the capacitor element is formed on the STI layer 14.

The capacitor element necessarily needs not to be formed in the element region. As shown in the third embodiment, it is possible to form the whole of the capacitor element on the element isolation region. The structure of the capacitor element itself formed on the STI layer 14 is common to that of the second embodiment.

Also in the case where the whole of the capacitor element is formed on the STI layer 14, it is possible to form the capacitor element, without burdens in processes, in the peripheral circuit region by use of the structure of the main circuit region of the third embodiment.

Particularly, in the case where the laminated film composed of the first electrode layer 13, the inter-electrode insulating film 15 and the second electrode layer 16 are simultaneously patterned to the same plane shape, the contact holes cannot be formed directly on the lower electrode of the capacitor. However, as shown in the second embodiment, by forming the structure in which the electrode is drawn out from the second electrode layer 16A through the opening portion 15H in the inter-electrode insulating film 15, it is possible to perform the electrode drawing-out from the lower electrode without burdens in processes.

As described above, though the trench type element isolation region is used as an element isolation region in any of the first to third embodiments, the structure of the element isolation region is not limited to the trench type, but the element isolation region may be a thick oxide layer formed by a LOCOS (local oxidation of silicon) or the like on the substrate surface.

(Fourth Embodiment)

In a fourth embodiment, described is a concrete example in which the semiconductor device of the foregoing first embodiment is applied to a non-volatile memory. A non-volatile memory having a stacked gate structure is provided in a main circuit formation region, and a capacitor element using this stacked gate structure is provided in a peripheral circuit region.

Figure 9:
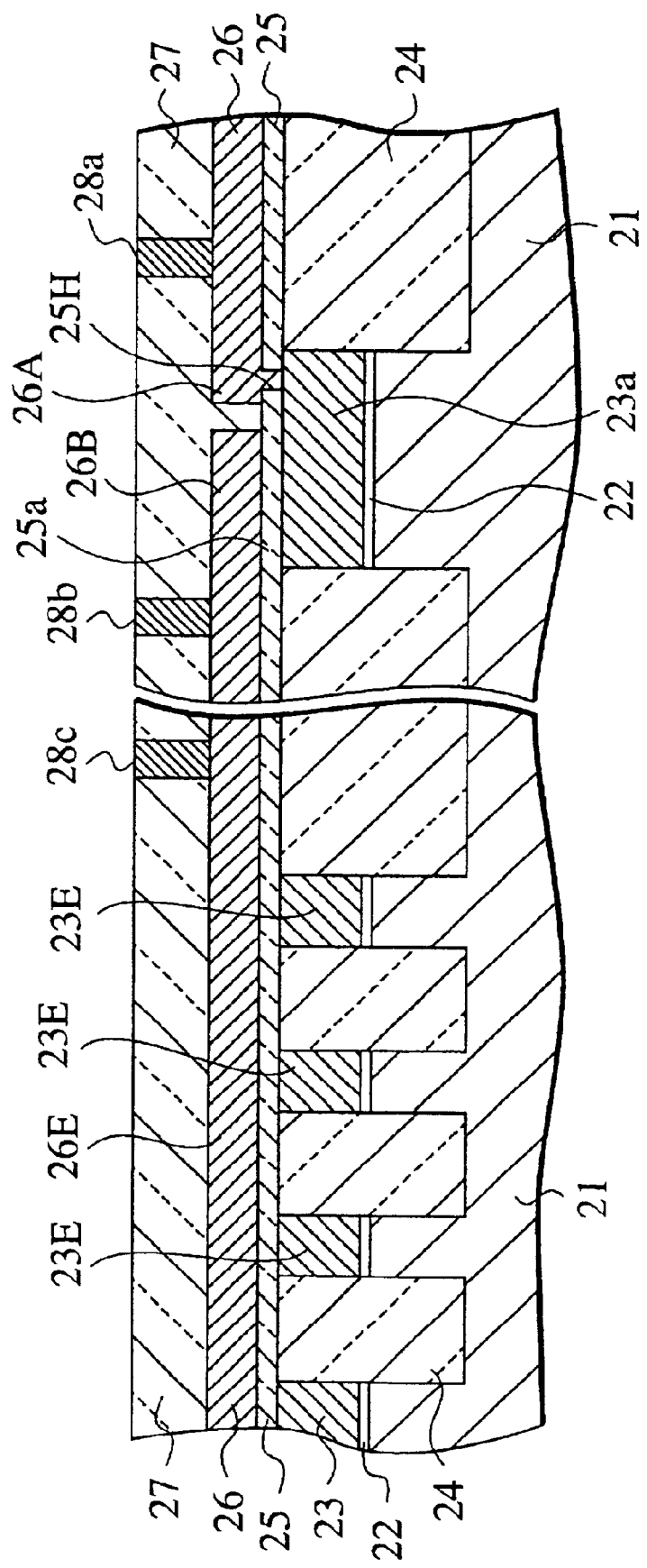
FIG. 9 is a section view showing a capacitor element structure in a memory cell region and a peripheral circuit region of a semiconductor device having a non-volatile memory cell according to a fourth embodiment of the present invention.

FIG. 9 shows a section view of the semiconductor device according to the fourth embodiment. Herein, as an example of the non-volatile memory, an NAND type flash memory is shown. In FIG. 9, a memory cell region is shown in the left, and a peripheral circuit region is shown in the right.

In the NAND type flash memory, a plurality of stripe-shaped control gate electrodes 26E and a plurality of stripe-shaped STI layers 24 are disposed so as to cross each other when viewed vertically from the above, and memory cells are provided in a matrix form. In FIG. 9, shown is a section obtained by cutting the plurality of STI layers 24 defining the memory cell region along a direction parallel to the stripe of the control gate electrodes 26E. In the same memory cell region, a selection gate transistor is also formed, and its illustration is omitted here.

As shown in FIG. 9, the semiconductor device according to the fourth embodiment has a self-alignment type STI structure. In each memory cell, a floating gate electrode layer 23 and a first gate insulating film 22 that is a tunnel oxide film are patterned in a self-alignment manner with the STI layer 24 that is an element isolation region. A second gate insulating film (inter-gate insulating film) 25 is formed on the STI layer 24 and floating gate electrodes 23E, and a control gate electrode layer 26 is formed on the second gate insulating film 25. The control gate electrode layer 26 is patterned to stripe-shaped control gate electrodes 26E. Moreover, the memory cell region is covered with an interlayer insulating layer 27, and each of the control gate electrode 26E is connected to the external wiring via a contact hole 28c provided in the interlayer insulating layer 27 on the end portion of the control gate electrode 26E.

On the other hand, in the peripheral circuit region, the capacitor element having the same structure as that of the first embodiment is formed. Specifically, a pattern formed of the same layer as the first gate insulating film 22 and the same layer as the floating gate electrode layer 23 is formed in a self-alignment manner with the STI layer 24. The same layer as the floating gate electrode layer 23 (hereinafter simply referred to as floating gate electrode layer) constitutes a lower electrode 23a of the capacitor element. Furthermore, the same layer as the second gate insulating film 25 (hereinafter simply referred to as second gate insulating film) is formed on the STI layer 24 and the floating gate electrode layer 23, and a capacitor storage layer 25a of the capacitor element is formed by this second gate insulating film 25. On the second gate insulating film 25, first and second regions 26A and 26B which are formed of the control gate electrode layer 26 are formed. The first and second regions 26A and 26B are electrically isolated from each other. The first region 26A is connected to the lower electrode of the capacitor element via an opening portion 25H formed in the inter-gate insulating film 25. On the other hand, the second region 26B constitutes an upper electrode of the capacitor element. Moreover, contact holes 28a and 28b for drawing electrodes are respectively formed on the first and second regions 26A and 26B at positions disposed above the STI layer 24.

Next, a method of manufacturing the semiconductor device according to the foregoing fourth embodiment will be described with reference to FIGS. 10A to 10F. The memory cell region shown in the left of each drawing and the peripheral circuit region shown in the right of each drawing are fabricated by use of common steps.

Figure 10A:
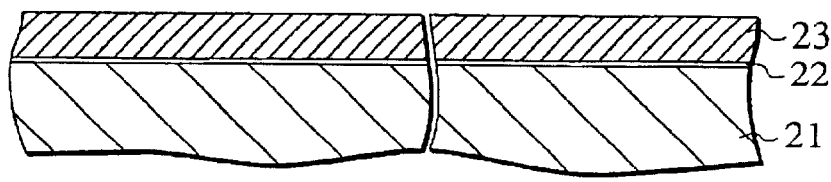
FIGS. 10A to 10F are steps showing a method of manufacturing the semiconductor device having the non-volatile memory according to the fourth embodiment of the present invention.

First, as shown in FIG. 10A, the first gate insulating film 22 which is used as a tunnel oxide film and the floating gate electrode layer 23 are laminated on a semiconductor substrate layer 21 in this order. Herein, for example, a Si substrate is used for the semiconductor substrate layer 21. The first gate insulating film 22 is a thin silicon oxide film having a thickness of, for example, about 10 nm, and can be formed by use of a CVD method, a thermal oxidation method or the like. The floating gate electrode layer 23 is, fore example, polycrystalline silicon, amorphous silicon or the like, which has a thickness ranging from about 50 to 100 nm, and can be formed by use of a sputtering method, a CVD method or the like.

Figure 10B:
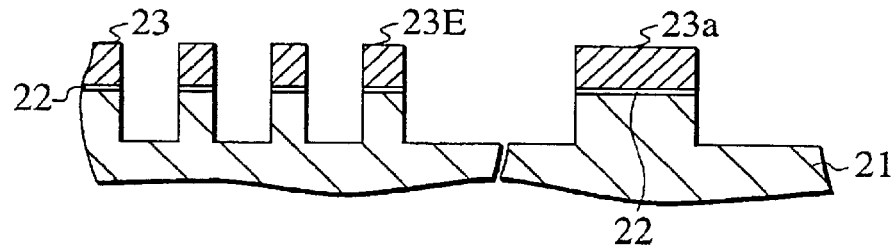

Subsequently, as shown in FIG. 10B, a trench is formed by use of a dry etching method or the like, which has a depth ranging from the floating gate electrode layer 23 to the semiconductor substrate layer 21 below the floating gate electrode layer 23. The depth of the trench from the surface position of the semiconductor substrate layer 21 shall be set to a range, for example, from 200 to 250 nm so as to be sufficiently deeper than the total thickness of the first gate insulating film 22 and the floating gate electrode layer 23.

Figure 10C:
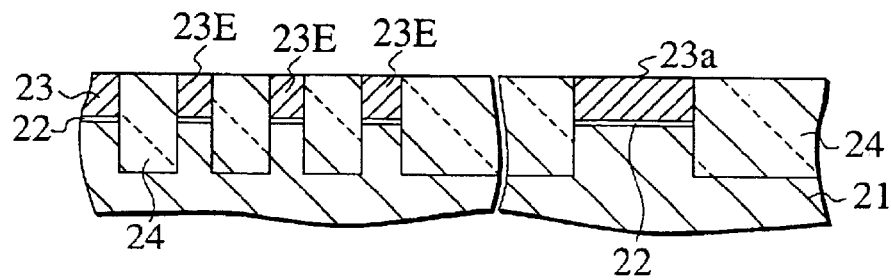

Next, as shown in FIG. 10C, the trench is filled up by an insulating film such as a TEOS (tetra-ethoxy-silane) film, an HDP (high density plasma) CVD oxide film and the like, which show a good burying property. The surface is flattened by use of a CMP method until the floating gate electrode layer 23 is exposed. Thus, the STI layer 24 is formed. By forming the STI layer 24, the floating gate electrode 23E constituting each memory cell is formed from the floating gate electrode layer 23 in a self-alignment manner with the STI layer 24. In addition, in the peripheral circuit region, the lower electrode 23a of the capacitor element is formed from the floating gate electrode layer 23 in a self-alignment manner with the STI layer 24.

Figure 10D:
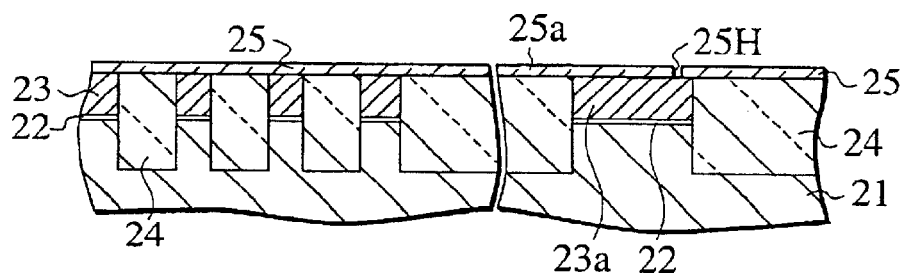

As shown in FIG. 10D, the second gate insulating film 25 is formed on a flattened surface of the resultant structure by use of a CVD method. This second insulating film 25 is, for example, a silicon oxide film, a silicon nitride film, a silicon oxide nitride film, or an ONO (oxide/nitride/oxide) film that is a laminated film obtained by laminating the silicon oxide film and the silicon nitride film. In the peripheral circuit region, the second gate insulating film 25 constitutes the charge storage layer 25a of the capacitor element. Thereafter, in the peripheral circuit region, the opening portion 25H to which the lower electrode 23a is exposed is formed by etching.

Figure 10E:
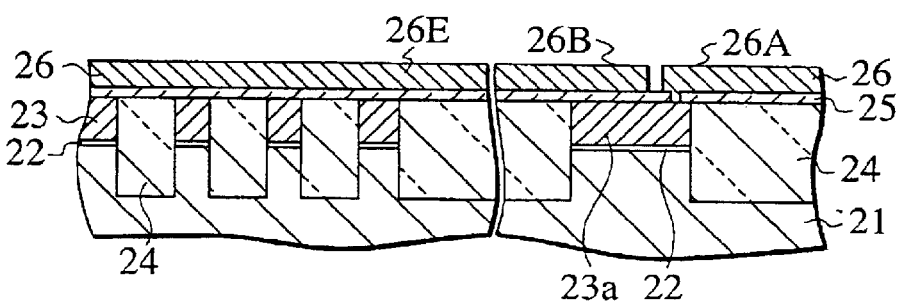

Subsequently, as shown in FIG. 10E, the control gate electrode layer 26 is formed on a surface of the resultant structure by use of a sputtering method, a CVD method or the like. The control gate electrode layer 26 may be, for example, a polycrystalline silicon film or a laminated film obtained by laminating the polycrystalline silicon film and a metal silicide film. Furthermore, as the metal silicide film, various materials such as WSi, TiSi and CoSi are enumerated. Besides these materials, the control gate may be constituted by a metal gate or a poly-metal gate, which are made of only a metallic material.

Next, the control gate electrode layer 26 is patterned. In the memory cell region, the stripe-shaped control gate electrodes 26E are formed, and, at the same time, also in the peripheral circuit region, patterning for separating the control gate electrode layer 26 into the first and second regions 26A and 26B is performed. The first region 26A is used as the upper electrode of the capacitor element.

Figure 10F:
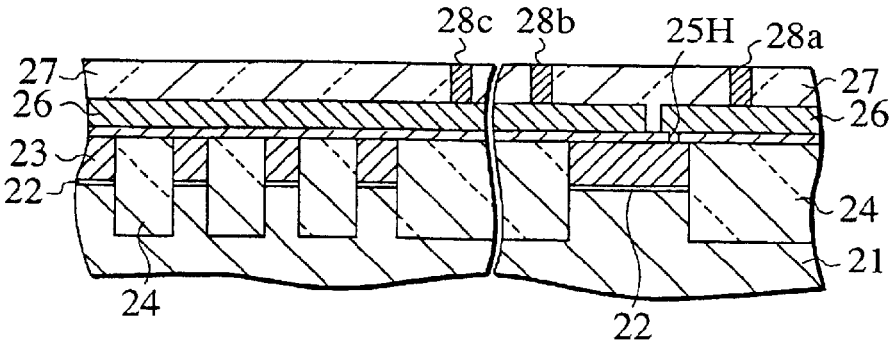

Moreover, as shown in FIG. 10F, a surface of the resultant structure is covered with the interlayer insulating layer 27 made of, for example, BPSG (boron phosphosilicate glass) or the like, and the contact holes 28a to 28c required for wiring are formed in the memory cell region and the peripheral circuit region, respectively, by use of an RIE (reactive ion etching) method. Thereafter, a conductive material such as W (tungsten) is buried in each of the contact holes 28a to 28c, and the surface is flattened. A necessary wiring is formed on the interlayer insulating layer 27. The electrode and the wiring layer are connected via each contact hole.

The conditions such as the thickness of the films and the materials of the films will be changed by a change of a design rule and an improvement of a manufacturing method, the change is a matter of course.

As described above, in the semiconductor device according to the fourth embodiment, the capacitor element formed in the peripheral circuit region can be fabricated with little burden on the fabrication process of the stacked gate structure in the memory cell region. A still another electrode layer needs not to be laminated in the floating gate electrode layer for forming a drawing electrode like the capacitor element of FIG. 2, and the pattern of the floating gate electrode layer formed in a self-alignment manner in the peripheral circuit region can be effectively used as the lower electrode of the capacitor element.

(Fifth Embodiment)

Figure 11:
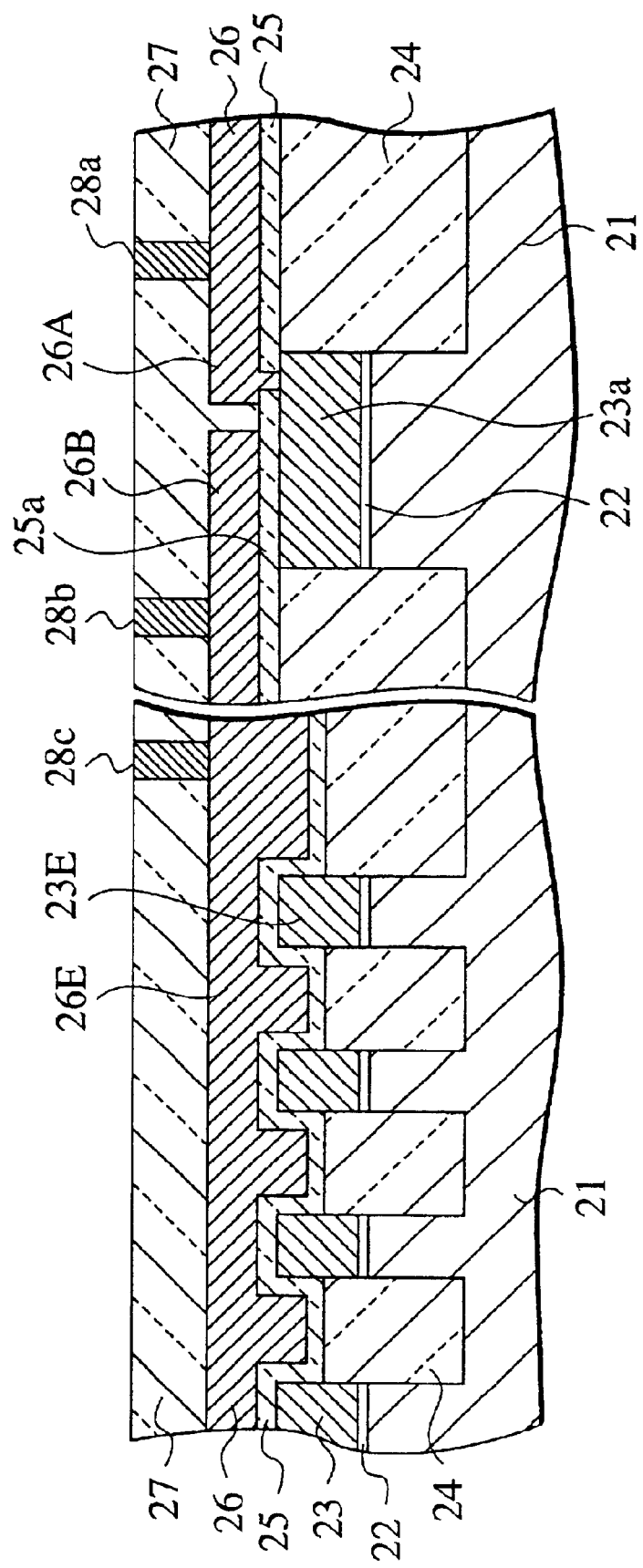
FIG. 11 is a section view showing a capacitor element structure in a memory cell region and a peripheral circuit region of a semiconductor device having a non-volatile memory cell according to a fifth embodiment of the present invention.

FIG. 11 shows a section view of a semiconductor device according to a fifth embodiment. The fifth embodiment is a modification of the fourth embodiment. Similarly to the fourth embodiment, a non-volatile memory forming a floating gate electrode in a self-alignment manner with a formation of an element isolation region is provided in a main circuit formation region, and a capacitor element using a stacked gate structure of the non-volatile memory is provided in a peripheral circuit region.

Herein, in a gate structure of a memory cell formed in the memory cell region, a surface position of the STI layer 24 is lower than that of the floating gate electrode layer 23, and a section of the inter-gate insulating film 25 formed on these surfaces forms unevenness due to the difference in level between these surfaces. As a result, because an effective area of the inter-gate insulating film 25 in each memory cell is enlarged, it is possible to further reduce the memory cell. To form this gate structure, in the method of manufacturing the semiconductor device according to the fourth embodiment, a process for selectively etching an upper layer of a STI layer may be added after the STI layer is formed and a surface of the STI layer is flattened.

Also in this case, a capacitor element in the peripheral circuit region can be formed the same structure as that of the fourth embodiment.

(Sixth Embodiment)

A semiconductor device of a sixth embodiment has a structure in which the capacitor element structure shown in the second embodiment is applied to a semiconductor device having a non-volatile memory using a non self-alignment type STI structure.

Figure 12:
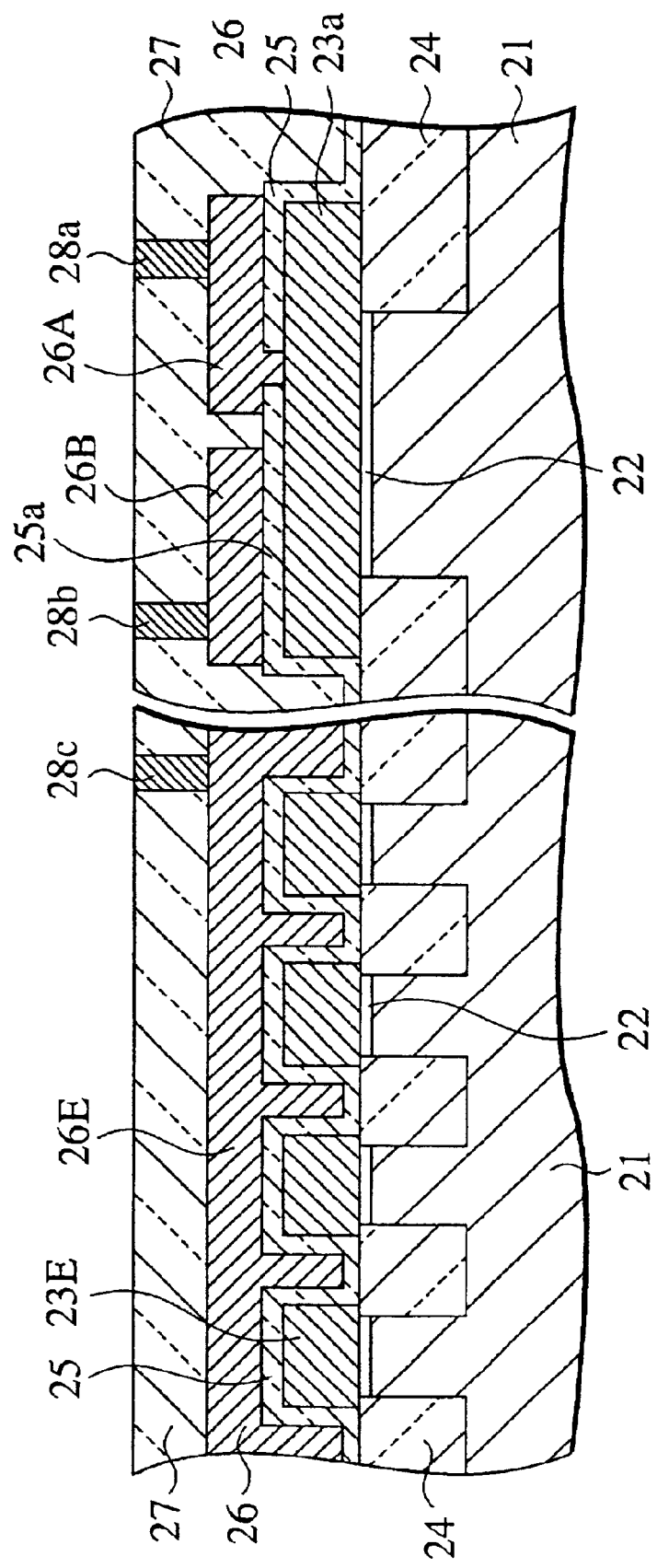
FIG. 12 is a section view showing a capacitor element structure in a memory cell region and a peripheral circuit region of a semiconductor device having a non-volatile memory cell according to a sixth embodiment of the present invention.

FIG. 12 is a section view of the semiconductor device according to the sixth embodiment. An NAND type flash memory is shown in the left of FIG. 12, and a capacitor element of a peripheral circuit region is shown in the right thereof.

As shown in FIG. 12, because the semiconductor device according to the sixth embodiment is not a self-alignment type, though a pattern of each of the first gate insulating films 22 is defined by the STI layer 24 in the memory cell region, each of the floating gate electrodes 23E is patterned independently of the STI layer 24. Each of the floating gate electrodes 23E is formed on the corresponding one of the first gate insulating films 22, and the surface of floating gate electrodes 23E are covered with the second gate insulating film (inter-gate insulating film) 25. Each of the control gate electrodes 26E is formed on the resultant structure, and the surface of the control gate electrodes 26E are covered with the interlayer insulating layer 27. Each of the control gate electrode 26E is connected to the external wiring via the contact hole 28c provided in the interlayer insulating layer 27 on the end portion of the control gate electrode 26E.

In this non self-alignment type NAND flash memory, the surface of the STI layer 24 and the surface of the first gate insulating film 22 have the same heights, however the surface of the STI layer 24 may be higher than the surface of the first gate insulating film 22. When the height of the surface of the STI layer 24 is lower than that of the surface of the first gate insulating film 22, the floating gate electrode 23E produces a difference in level around the corner of the STI layer. The difference may cause a corner parasitic device. In the case of the self-alignment NAND type flash memory, such a problem does not occur.

On the other hand, a capacitor element having approximately the same structure as that of the second embodiment is formed in the peripheral circuit region. The lower electrode 23a of the capacitor element is formed of the same layer as the floating gate electrode layer 23. The charge storage layer 25a is formed of the same layer as the second gate insulating film 25. Moreover, the control gate electrode layer 26 is patterned, thus obtaining the first and second regions 26A and 26B which are electrically isolated from each other. The first region 26A is used as a drawing electrode of the lower electrode, and the second region 26B is used as an upper electrode of the capacitor element. Herein, the height of the surface of the first gate insulating film 22 is made to be equal to that of the STI layer 24 so as to correspond to the structure of the memory cell. As described later, patterning for the capacitor element is performed for each layer simultaneously with patterning for the memory cell region.

A method of manufacturing the semiconductor device according to the sixth embodiment will be briefly described below with reference to FIGS. 13A to 13F. The film formation methods and the materials of the films in the method of manufacturing the semiconductor device of the fourth embodiment can be applied to those of the sixth embodiment. Furthermore, steps progress simultaneously in the memory cell region and the peripheral circuit region unless special notice.

Figure 13A:
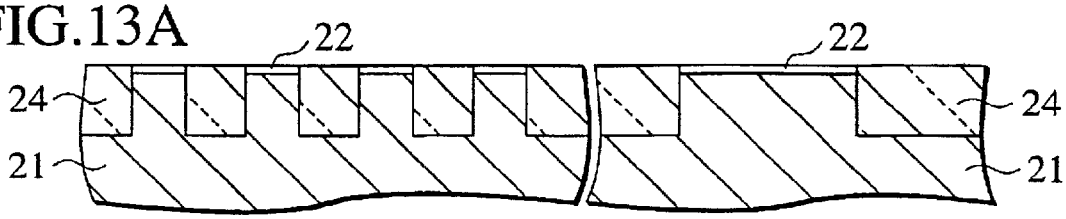
FIGS. 13A to 13F are steps showing a method of manufacturing the semiconductor device having the non-volatile memory according to the sixth embodiment of the present invention.
Figure 13B:
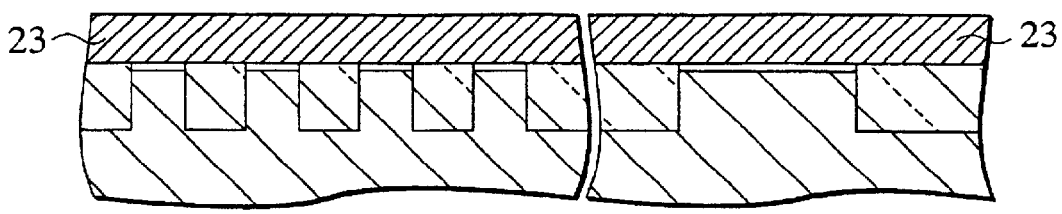

First, the first gate insulating film 22 is formed on the semiconductor substrate 21. Thereafter, a trench for the STI layer 24 is formed. An insulating film is buried in this trench, and a surface of the resultant is flattened by CMP processing, and the STI layer 24 and the first gate insulating film 22 are exposed (FIG. 13A).

Figure 13C:
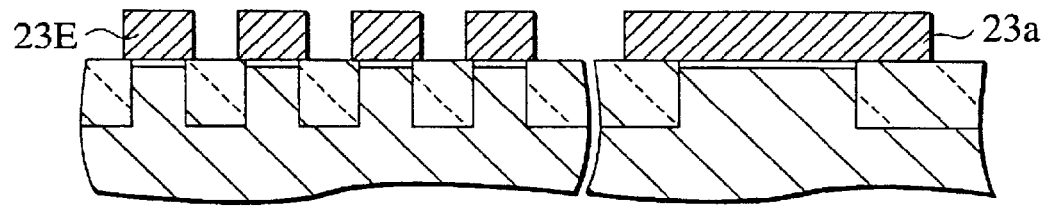

Next, the floating gate electrode layer 23 is formed on the STI layer 24 and the first gate insulating film 22 (FIG. 13B), and then the floating gate electrode layer 23 is patterned. Thus, each of the floating gate electrodes 23E is obtained in the memory cell region, and the lower electrode (23a) is obtained in the peripheral circuit region (FIG. 13C).

Figure 13D:
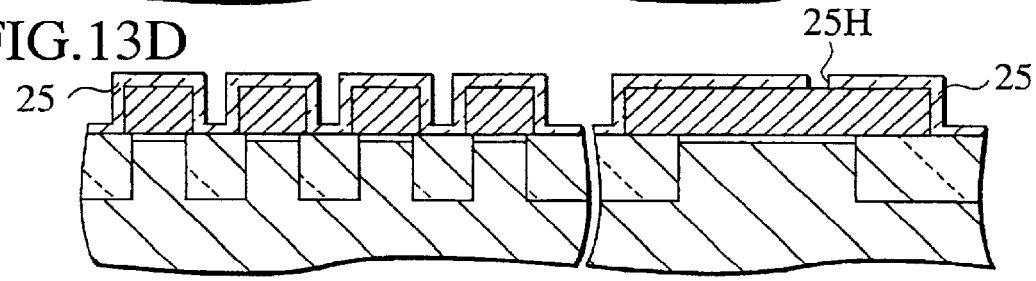

Subsequently, a surface of the resultant structure is covered with the second gate insulating film 25. Thereafter, in the peripheral circuit region, the opening portion 25H is formed in the second gate insulating film 25 (FIG. 13D).

Figure 13E:
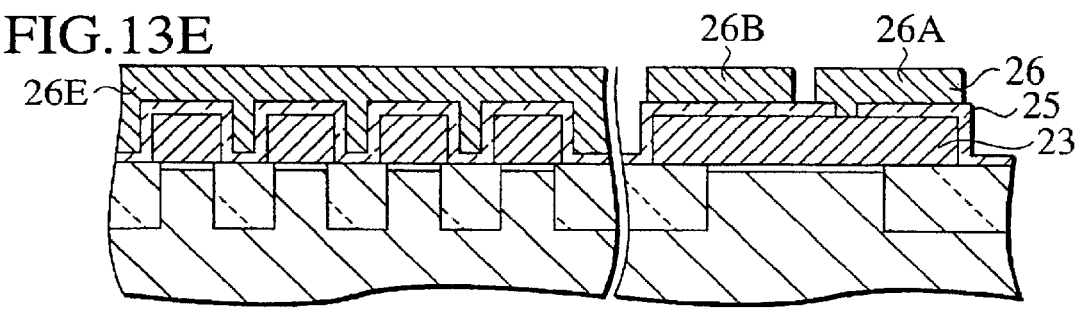

A surface of the resultant structure is covered with the control gate electrode layer 26, and then patterning is performed for the control gate electrode layer 26. Thus, each control gate electrode 26E is obtained in the memory cell region, and, at the same time, the first and second regions 26A and 26B which are electrically isolated from each other are obtained in the peripheral circuit region (FIG. 13E).

Figure 13F:
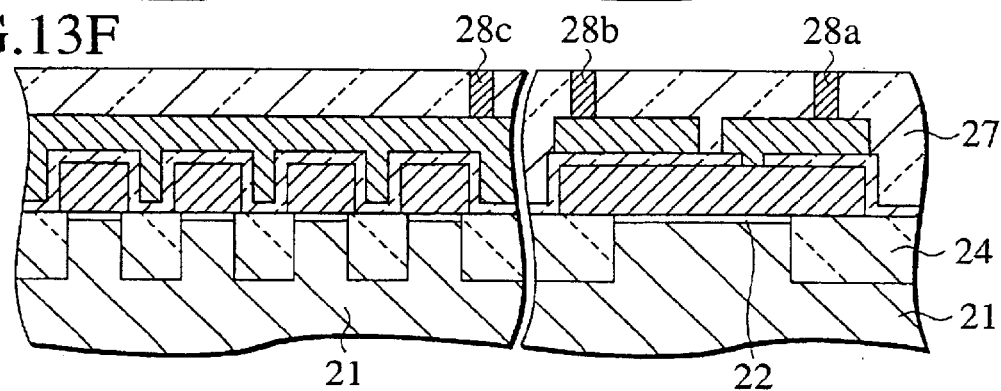

The interlayer insulating layer 27 is formed on a surface of the resultant structure, and the contact holes 28a to 28c necessary for the wiring are formed in the memory cell region and the peripheral circuit region, respectively. Thereafter, a conductive material is buried in the contact holes, and then a surface of the resultant structure is flattened (FIG. 13F).

According to the structure of the semiconductor device of the sixth embodiment, it is possible to form the capacitor element structure in the peripheral circuit region with little burdens in processes of the memory cell.

(Seventh Embodiment)

A seventh embodiment concerns an application of the capacitor element structure of the third embodiment to a semiconductor device having a non-volatile memory using a non self-alignment type STI structure.

Figure 14:
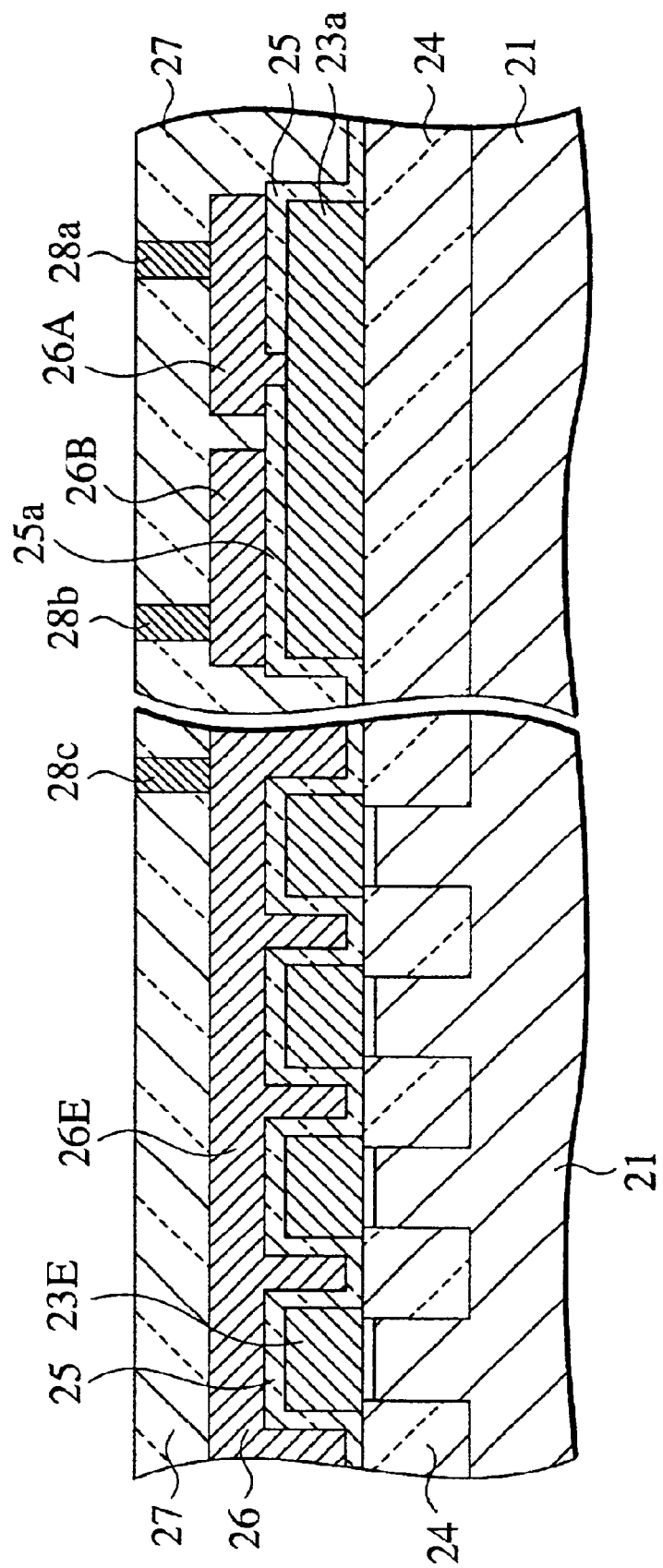
FIG. 14 is a section view showing a capacitor element structure in a memory cell region and a peripheral circuit region of a semiconductor device having a non-volatile memory cell according to a seventh embodiment of the present invention.

In FIG. 14, a section view of the semiconductor device according to the seventh embodiment is shown. A memory cell region is identical to the memory cell structure of the sixth embodiment. Moreover, a structure of a capacitor element formed in the peripheral circuit region is similar to that of the capacitor element of the third embodiment.

With respect to a method of manufacturing the semiconductor device, the same method as that of the sixth embodiment can be used except for that the capacitor element is formed on the STI layer 24.

(Use of Capacitor Element)

Each capacitor element described in the first to seventh embodiments can be used as capacitors of various peripheral circuits used in semiconductor integrated circuits. For example, as concrete uses of the capacitor element, a delay circuit, a voltage boosting circuit, a voltage output circuit, a voltage conversion circuit and the like can be enumerated.

Figure 15A:
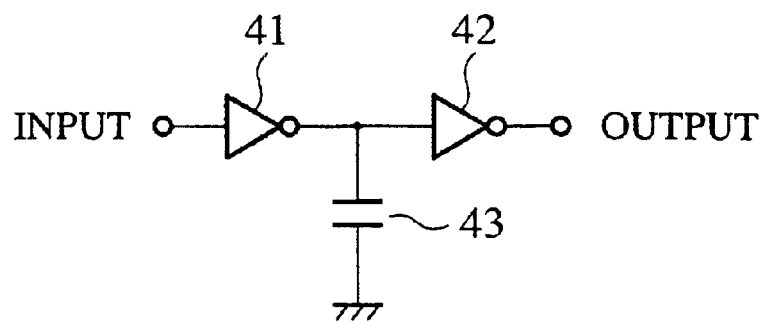
FIGS. 15A to 15D are circuit diagrams of circuits having capacitors.

FIG. 15A is an example of a delay circuit for delaying an input signal in a semiconductor integrated circuit. This delay circuit is constituted by two inverters 41 and 42 connected in series, and a capacitor 43 for delaying the signal, which is connected between an output node of the inverter 41 and a supply node of the inverter 42, which is an earth potential.

Figure 15B:
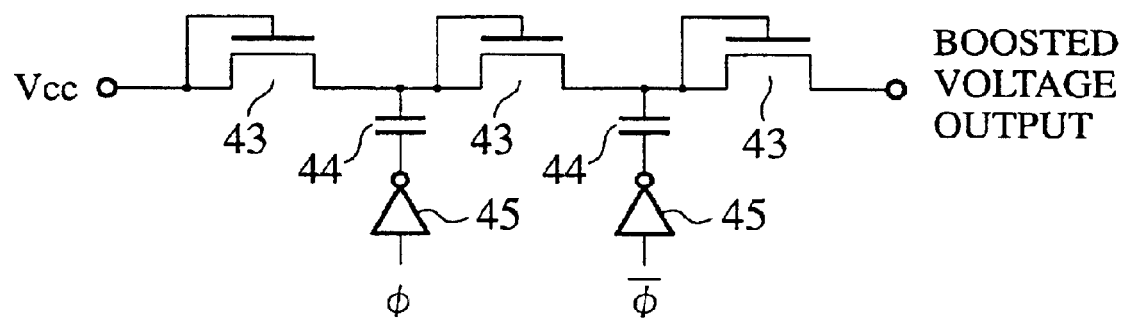

FIG. 15B is an example of a voltage boosting circuit which boosts a power source voltage to produce a high voltage in a semiconductor integrated circuit. This voltage boosting circuit is constituted by a plurality of MOS type transistors 43 connected in series between a supply node of a power source voltage Vcc and a voltage output node of the voltage boosting circuit, in each of which a drain and a source are connected to each other; a plurality of bootstrap capacitors 44, each having one end connected to a series connection node of the corresponding one of the transistors 43; and a plurality of inverters 45 supplying a clock pulse Φ or Φ connected to the other end of the corresponding one of the bootstrap capacitors 44.

Figure 15C:
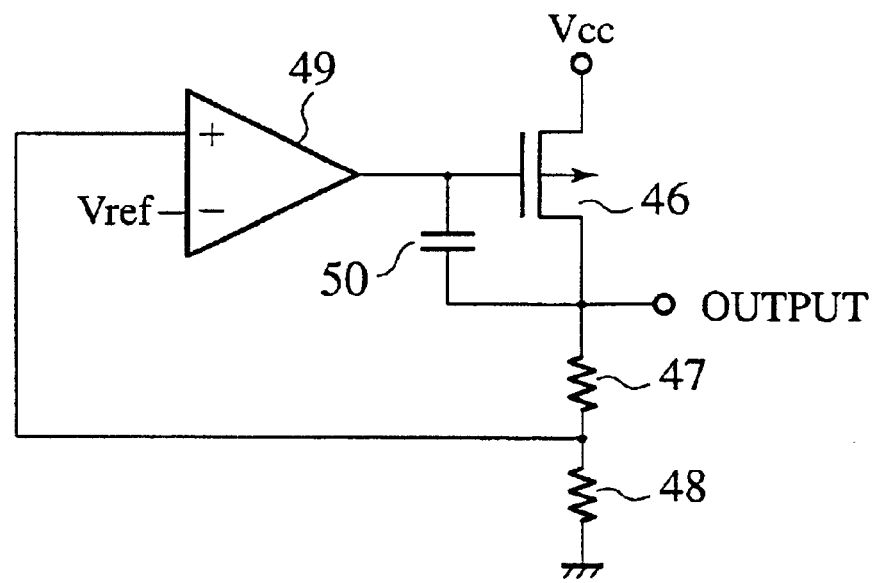

FIG. 15C is an example of a voltage output circuit which sets a voltage in accordance with a reference voltage in a semiconductor integrated circuit to output it. This voltage output circuit is constituted by a (P channel type) MOS transistor 46 connected between a supply node of a power source voltage Vcc and a voltage output node of the voltage output circuit; two voltage dividing resistors 47 and 48 connected in series between the voltage output node and a supply node of an earth potential; a differential amplifier 49 for generating a voltage in accordance with a difference between a voltage divided by the resistors 47 and 48 and a reference voltage Vref and for supplying the generated voltage to a gate of the foregoing transistor 46; and a phase compensation capacitor 50 connected between the gate of the foregoing transistor 46 and the voltage output node.

Figure 15D:
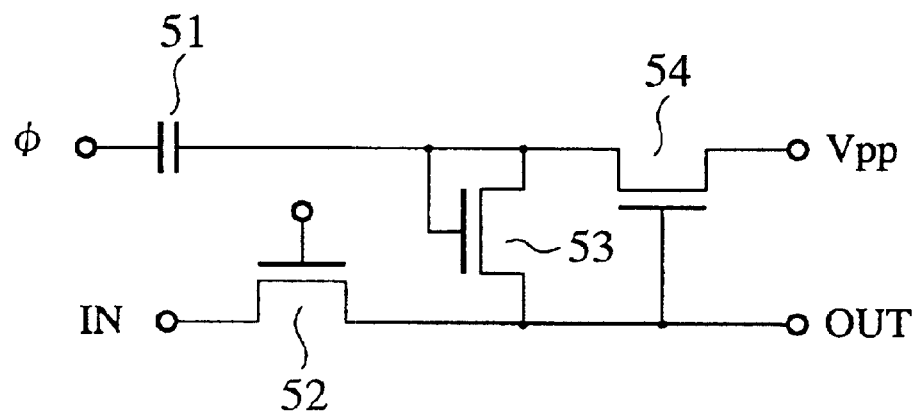

FIG. 15D is an example of a voltage conversion circuit in a semiconductor integrated circuit. This voltage conversion circuit converts a high level potential of an input pulse IN having predetermined voltage amplitude (Vcc) to a level of a high voltage Vpp, and outputs a pulse OUT. The voltage conversion circuit is constituted by a bootstrap capacitor 51 to which a clock pulse Φ is supplied; and three MOS transistors 52, 53 and 54.

The semiconductor device of the present invention is described above in accordance with the embodiments. The semiconductor device of the present invention is not limited to the above-described embodiments. It is obvious to persons skilled in the art that various modifications and alternates of materials are possible.

In the foregoing embodiments, though the NAND flash type memory cell is described as the example of the memory cell, the memory cell structure itself is not limited to the NAND type flash memory, but is common to AND type, DINOR type and NOR type flash memory cells. Accordingly, the semiconductor device structure of the present invention and the method of manufacturing the same of the present invention can be applied also to semiconductor devices having these flash memories in a main circuit region. Moreover, in terms of writing style to the memory, the structure of the present invention and the manufacturing method of the present invention can be applied to any memory cell in addition to the flash type memory cell as long as it adopts a similar memory cell structure. Moreover, the structure of the present invention and the manufacturing method of the present invention can be applied to EPROM and the like in addition to EEPROM. In the first to third embodiments, the structure formed in the main circuit region is not limited to the memory cell structure.

What is claimed is:

1. A semiconductor device comprising:
   a semiconductor substrate;
   a main circuit region provided on the semiconductor substrate;
   a structure in which a first electrode layer, an inter-electrode insulating film and a second electrode layer are sequentially laminated, the structure being formed in the main circuit region;
   a peripheral circuit region provided around the main circuit region on the semiconductor substrate, the peripheral circuit region having a capacitor element provided;
   a lower electrode of the capacitor element formed of the same layer as the first electrode layer formed in the peripheral circuit region;
   a charge storage layer of the capacitor element formed on the lower electrode, the charge storage layer being formed of the same layer as the inter-electrode insulating film;
   an opening portion formed in the charge storage layer and spaced form each of the storage layer, the opening portion having a bottom to which the lower electrode is exposed;
   a first region formed on the charge storage layer and formed of the same layer as the second electrode layer, the first region being electrically connected to the lower electrode via the opening portion; and
   an upper electrode of the capacitor element formed on the charge storage layer and formed of the same layer as the first region, the upper electrode being electrically isolated from the first region;
   element isolation regions buried in the semiconductor substrate;
   an interlayer insulating layer covering the first region and the upper electrode;
   a first contact hole formed in the interlayer insulating layer, the first contact hole having a contact portion on the first region; and
   a second contact hole formed in the interlayer insulating layer, the second contact hole having a contact portion on the upper electrode,
   wherein the first region and the upper electrode at least partially overlap the element isolation regions, respectively, and both the first contact hole and the second contact hole are formed above the element isolation regions but not above the lower electrode.

2. The semiconductor device according to claim 1, wherein
   the capacitor element is used for any one selected from the group consisting of a delay circuit, a voltage boosting circuit, a voltage output circuit and a voltage conversion circuit.

3. The semiconductor device according to claim 1, wherein
   the element isolation region is an insulating layer buried in a trench having a depth reaching the semiconductor substrate from the first electrode layer, and
   a plane pattern of the first electrode layer is defined in a self-alignment manner by a plane pattern of the element isolation region.

4. The semiconductor device according to claim 3, wherein
   the capacitor element is used for any one selected from the group consisting of a delay circuit, a voltage boosting circuit, a voltage output circuit and a voltage conversion circuit.

5. The semiconductor device according to claim 1, wherein
   the element isolation region is an insulating layer buried in a trench provided in the semiconductor substrate, and
   a plane pattern of the first electrode layer is formed independently of a plane pattern of the element isolation region.

6. The semiconductor device according to claim 5, wherein
   the capacitor element is used for any one selected from the group consisting of a delay circuit, a voltage boosting circuit, a voltage output circuit and a voltage conversion circuit.

7. The semiconductor device according to claim 1, wherein
   the capacitor element is used for any one selected from the group consisting of a delay circuit, a voltage boosting circuit, a voltage output circuit and a voltage conversion circuit.

8. The semiconductor device according to claim 1, wherein
   the element isolation region is an insulating layer buried in a trench having a depth reaching the semiconductor substrate from the first electrode layer, and
   a plane pattern of the first electrode layer is defined in a self-alignment manner by a plane pattern of the element isolation region.

9. The semiconductor device according to claim 1, wherein
   the element isolation region is an insulating layer buried in a trench provided in the semiconductor substrate, and
   a plane pattern of the first electrode layer is formed independently of a plane pattern of the element isolation region.

10. A semiconductor device comprising:
    a semiconductor substrate;
    a non-volatile memory region provided on the semiconductor substrate;
    a first gate insulating film formed on the semiconductor substrate in the non-volatile memory region;
    a floating gate electrode layer formed on the first gate insulating film;

a second gate insulating film formed on the floating gate electrode layer;

a control gate electrode layer formed on the second gate insulating film;

a peripheral circuit region formed around the non-volatile memory region on the semiconductor substrate, the peripheral circuit region having a capacitor element provided;

a lower electrode of the capacitor element, the lower electrode being formed of the same layer as the floating gate electrode layer and formed in the peripheral circuit region;

a charge storage layer of the capacitor element, the charge storage layer being formed on the lower electrode and formed of the same layer as the second gate insulating film;

an opening portion formed in the charge storage layer and spaced from each edge of the storage layer, the opening portion having a bottom to which the lower electrode is exposed;

a first region formed on the charge storage layer and formed of the same layer as the control gate electrode layer, the first region being electrically connected to the lower electrode via the opening portion;

an upper electrode of the capacitor element formed on the charge storage layer and formed of the same layer as the first region, the upper electrode being formed of the same layer as the control gate electrode layer and electrically isolated from the first region;

element isolation regions buried in the semiconductor substrate;

an interlayer insulating layer covering the first region and the upper electrode;

a first contact hole formed in the interlayer insulating layer, the first contact hole having a contact portion on the first region; and a second contact hole formed in the interlayer insulating layer, the second contact hole having a contact portion on the upper electrode, wherein the first region and the upper electrode at least partially overlap the element isolation regions, respectively, and both the first contact hole and the second contact hole are formed above the element isolation regions but not above the lower electrode.

11. The semiconductor device according to claim 10, wherein the capacitor element is used for any one selected from the group consisting of a delay circuit, a voltage boosting circuit, a voltage output circuit and a voltage conversion circuit.

12. The semiconductor device according to claim 11, wherein the non-volatile memory is any one of EPROM and EEPROM.

13. The semiconductor device according to claim 11, wherein the non-volatile memory is any one selected from the group consisting of NAND type, AND type, DINOR type and NOR type EEPROMs, the non-volatile memory has a memory cell array in a non-volatile memory region thereof, and the element isolation region defines each memory cell region, and defines in a self-alignment manner plane patterns of the first gate insulating film and the floating gate electrode layer in each memory cell region.

14. The semiconductor device according to claim 11, wherein the element isolation region is an insulating layer buried in a trench provided in a surface of the semiconductor substrate on which the first gate insulating film and the floating gate electrode layer are formed; and a plane pattern of the floating gate electrode layer is defined in a self-alignment manner by a plane pattern of the element isolation region.

15. The semiconductor device according to claim 14, wherein the capacitor element is used for any one selected from the group consisting of a delay circuit, a voltage boosting circuit, a voltage output circuit and a voltage conversion circuit.

16. The semiconductor device according to claim 14, wherein the non-volatile memory is any one selected from the group consisting of EPROM and EEPROM.

17. The semiconductor device according to claim 14, wherein the non-volatile memory is any one selected from the group consisting of NAND type, AND type, DINOR type and NOR type EEPROMs, the non-volatile memory has a memory cell array in a non-volatile memory region thereof, and the element isolation region defines each memory cell region, and defines in a self-alignment manner plane patterns of the first gate insulating film and the floating gate electrode layer in each memory cell region.

18. The semiconductor device according to claim 11, wherein the element isolation region is an insulating layer buried in a trench provided in the semiconductor substrate, and a plane pattern of the floating gate electrode layer is formed independently of a plane pattern of the element isolation region.

19. The semiconductor device according to claim 18, wherein the capacitor element is used for any one selected from the group consisting of a delay circuit, a voltage output circuit and a voltage conversion circuit.

20. The semiconductor device according to claim 18, wherein the non-volatile memory is any one selected from the group consisting of EPROM and EEPROM.

21. The semiconductor device according to claim 10, wherein the non-volatile memory is any one of EPROM and EEPROM.

22. The semiconductor device according to claim 21, wherein the capacitor element is used for any one selected from the group consisting of a delay circuit, a voltage boosting circuit, a voltage output circuit and a voltage conversion circuit.

23. The semiconductor device according to claim 10, wherein the capacitor element is used for any one of a delay circuit, a voltage boosting circuit, a voltage output circuit and a voltage conversion circuit.

24. The semiconductor device according to claim 10, wherein the non-volatile memory is any one of EPROM and EEPROM.

25. The semiconductor device according to claim 10, wherein the non-volatile memory is any one of NAND type, AND type, DINOR type and NOR type EEPROMs, and the non-volatile memory has a memory cell array in a non-volatile memory region thereof, and the element isolation region defines each memory cell region, and defines in a self-alignment manner plane patterns of the first gate insulating film and the floating gate electrode layer in each memory cell region.

26. The semiconductor device according to claim 10, wherein the element isolation region is an insulating layer buried in a trench provided in a major surface of the semiconductor substrate on which the first gate insulating film and the floating gate electrode layer are formed; and a plane pattern of the floating gate electrode layer is defined in a self-alignment manner by a plane pattern of the element isolation region.

27. The semiconductor device according to claim 10, wherein the element isolation region is an insulating layer buried in a trench provided in the semiconductor substrate, and a plane pattern of the floating gate electrode layer is formed independently of a plane pattern of the element isolation region.

\* \* \* \* \*